(12) United States Patent
Kim et al.

(10) Patent No.: US 12,190,791 B2
(45) Date of Patent: Jan. 7, 2025

(54) GATE DRIVING CIRCUIT AND DISPLAY APPARATUS INCLUDING THE SAME

(71) Applicant: Samsung Display Co., Ltd., Yongin-Si (KR)

(72) Inventors: Hyuk Kim, Yongin-si (KR); Jonghee Kim, Yongin-si (KR); Doo-Young Lee, Yongin-si (KR); Chang-Soo Lee, Yongin-si (KR); Sang-Uk Lim, Yongin-si (KR); Boyong Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/143,011

(22) Filed: May 3, 2023

(65) Prior Publication Data

US 2024/0078962 A1 Mar. 7, 2024

(30) Foreign Application Priority Data

Sep. 2, 2022 (KR) .................. 10-2022-0111521

(51) Int. Cl.
*G09G 3/32* (2016.01)
*H01L 27/12* (2006.01)

(52) U.S. Cl.
CPC ....... *G09G 3/32* (2013.01); *G09G 2300/0426* (2013.01); *G09G 2300/0819* (2013.01);
(Continued)

(58) Field of Classification Search
CPC ....... G09G 2310/0286; G09G 2310/08; G09G 2310/0267; G09G 2310/0289; G09G 2310/0291; G09G 3/3677; G09G 3/3266; G09G 3/20; G09G 3/3233; G09G 3/3674; G09G 3/3648; G09G 3/32; G09G 3/3696; G09G 2300/0408; G09G 2300/0426;
(Continued)

(56) References Cited

U.S. PATENT DOCUMENTS 8,816,728 B2  8/2014 Yoon et al.
2017/0256218 A1* 9/2017 Dai .................... G11C 19/28
(Continued)

FOREIGN PATENT DOCUMENTS

KR  10-0902068 B1  6/2009
KR  10-1963595 B1  4/2019
(Continued)

*Primary Examiner* — Dong Hui Liang
(74) *Attorney, Agent, or Firm* — Innovation Counsel LLP

(57) ABSTRACT

Provided is a gate driving circuit comprising an N-th stage and an N+1-th stage. The N-th stage outputs an N-th scan gate signal based on an N-th scan clock signal, a voltage of a QN node, and a voltage of a QBN node and to output an N-th carry signal based on an N-th carry clock signal, the voltage of the QN node, and the voltage of the QBN node. The N+1-th stage outputs an N+1-th scan gate signal based on an N+1-th scan clock signal, a voltage of a QN+1 node, and the voltage of the QBN node and an N+1-th carry signal based on an N+1-th carry clock signal, the voltage of the QN+1 node, and the voltage of the QBN node. The N-th stage and the N+1-th stage share an inverting circuit. The inverting circuit controls the QBN node based on a third signal. N is a positive integer.

20 Claims, 11 Drawing Sheets

(52) U.S. Cl.
CPC ............. *G09G 2300/0852* (2013.01); *G09G 2310/0267* (2013.01); *G09G 2310/08* (2013.01); *H01L 27/124* (2013.01)

(58) Field of Classification Search
CPC ... G09G 2300/0842; G09G 2300/0819; G09G 2230/00
See application file for complete search history.

(56) References Cited

U.S. PATENT DOCUMENTS

| | | | |
|---|---|---|---|
| 2020/0349892 A1* | 11/2020 | Park | G09G 3/3275 |
| 2020/0380911 A1 | 12/2020 | Park et al. | |
| 2021/0210019 A1 | 7/2021 | Han et al. | |
| 2022/0358873 A1* | 11/2022 | Hwang | G09G 3/3266 |

FOREIGN PATENT DOCUMENTS

| | | |
|---|---|---|
| KR | 10-2020-0137072 A | 12/2020 |
| KR | 10-2021-0083620 A | 7/2021 |
| KR | 10-2021-0089296 A | 7/2021 |

* cited by examiner

GATE DRIVING CIRCUIT AND DISPLAY APPARATUS INCLUDING THE SAME

PRIORITY STATEMENT

This application claims priority under 35 U.S.C. § 119 to Korean Patent Application No. 10-2022-0111521, filed on Sep. 2, 2022 in the Korean Intellectual Property Office KIPO, the contents of which are herein incorporated by reference in their entireties.

BACKGROUND

1. Field

The present disclosure generally relates to a gate driving circuit and a display apparatus including the gate driving circuit. More particularly, the present disclosure relates to a gate driving circuit for reducing a dead space of a display apparatus and a display apparatus including the gate driving circuit.

2. Description of the Related Art

Generally, a display apparatus includes a display panel and a display panel driver. The display panel displays an image based on input image data. The display panel includes a plurality of gate lines, a plurality of data lines and a plurality of pixels. The display panel driver includes a gate driver and a data driver. The gate driver outputs gate signals to the gate lines. The data driver outputs data voltages to the data lines.

When the gate driver is integrated on the display panel, the number of transistors in the gate driver and the number of signal lines may affect a dead space of the display apparatus. For example, when the number of the transistors in the gate driver is great and the number of the signal lines is great, the dead space of the display apparatus may be large.

SUMMARY

The present disclosure provides a gate driving circuit for reducing a dead space of a display apparatus.

The present disclosure also provides a display apparatus including the gate driving circuit.

In an embodiment of a gate driving circuit according to the present disclosure, the gate driving circuit includes an N-th stage and an N+1-th stage. The N-th stage outputs an N-th scan gate signal based on an N-th scan clock signal, a voltage of a QN node, and a voltage of a QBN node and to output an N-th carry signal based on an N-th carry clock signal, the voltage of the QN node, and the voltage of the QBN node. The N+1-th stage outputs an N+1-th scan gate signal based on an N+1-th scan clock signal, a voltage of a QN+1 node, and the voltage of the QBN node and an N+1-th carry signal based on an N+1-th carry clock signal, the voltage of the QN+1 node, and the voltage of the QBN node. The N-th stage and the N+1-th stage share an inverting circuit. The inverting circuit controls the QBN node based on a third signal. N is a positive integer.

In an embodiment, the inverting circuit may include a 15-1 transistor, a 15-2 transistor, and an eighteenth transistor. The 15-1 transistor may include a control electrode to receive the third signal, a first electrode to receive the third signal, and a second electrode connected to a second electrode of the 15-2 transistor. The 15-2 transistor may include a control electrode to receive the third signal, a first electrode connected to a control electrode of the eighteenth transistor, and the second electrode connected to the second electrode of the 15-1 transistor. The eighteenth transistor includes the control electrode connected to the first electrode of the 15-2 transistor, a first electrode to receive the third signal, and a second electrode connected to the QBN node.

In an embodiment, the inverting circuit may further include a sixteenth transistor and a seventeenth transistor. The sixteenth transistor may include a control electrode connected to the QN node, a first electrode to receive a second low voltage, and a second electrode connected to the control electrode of the eighteenth transistor. The seventeenth transistor may include a control electrode connected to the QN+1 node, a first electrode to receive the second low voltage, and a second electrode connected to the control electrode of the eighteenth transistor.

In an embodiment, the N-th stage and the N+1-th stage may share a first sensing circuit. The first sensing circuit may include a twenty first transistor, a twenty second transistor and a twenty third transistor. The twenty first transistor may include a control electrode to receive a first signal, a first electrode to receive a previous carry signal which is one of carry signals of previous stages, and a second electrode connected to a second electrode of the twenty second transistor. The twenty third transistor may include a control electrode to receive the first signal, a first electrode connected to the second electrode of the twenty first transistor, and a second electrode connected to a control electrode of the twenty second transistor. The twenty second transistor may include the control electrode connected to the second electrode of the twenty third transistor, a first electrode to receive a sixth signal, and the second electrode connected to the second electrode of the twenty first transistor.

In an embodiment, the first sensing circuit may further include a twenty sixth transistor and a twenty seventh transistor. The twenty sixth transistor may include a control electrode to receive a second signal, a first electrode connected to a second electrode of the twenty seventh transistor, and a second electrode connected to the QBN node. The twenty seventh transistor may include a control electrode connected to the second electrode of the twenty third transistor, a first electrode to receive a first low voltage, and the second electrode connected to the first electrode of the twenty sixth transistor.

In an embodiment, the N-th stage may include a second sensing circuit. The second sensing circuit of the N-th stage may include a twenty fourth transistor, a 25-1 transistor, a 25-2 transistor, and a third capacitor. The twenty fourth transistor of the N-th stage may include a control electrode connected to the second electrode of the twenty third transistor, a first electrode to receive the sixth signal, and a second electrode connected to a first electrode of the 25-1 transistor of the N-th stage. The 25-1 transistor of the N-th stage may include a control electrode to receive a second signal, the first electrode connected to the second electrode of the twenty fourth transistor of the N-th stage, and a second electrode connected to a first electrode of the 25-2 transistor of the N-th stage. The 25-2 transistor of the N-th stage may include a control electrode to receive the second signal, the first electrode connected to the second electrode of the 25-1 transistor of the N-th stage, and a second electrode connected to the QN node. The third capacitor may include a first electrode to receive the sixth signal, and a second electrode connected to the control electrode of the twenty fourth transistor of the N-th stage.

In an embodiment, the N+1-th stage may include a second sensing circuit. The second sensing circuit of the N+1-th stage may include a twenty fourth transistor, a 25-1 transistor, and a 25-2 transistor. The second sensing circuit of the N-th stage and the second sensing circuit of the N+1-th stage may share the third capacitor.

In an embodiment, the N-th stage may include a first pull up control circuit. The first pull up control circuit may output a previous carry signal which is one of carry signals of previous stages to the QN node in response to the previous carry signal.

In an embodiment, the N-th stage may further include a second pull up control circuit. The second pull up control circuit may output a first low voltage to the QN node in response to a next carry signal which is one of carry signals of next stages.

In an embodiment, the N-th stage may further include a third pull up control circuit. The third pull up control circuit may output the first low voltage to the QN node in response to the voltage of the QBN node.

In an embodiment, the N-th stage may include a first pull down control circuit. The first pull down control circuit may output a first low voltage to the QBN node in response to the voltage of the QN node.

In an embodiment, the N-th stage may further include a second pull down control circuit. The second pull down control circuit may output the first low voltage to the QBN node in response to a previous carry signal which is one of carry signals of previous stages.

In an embodiment, the N-th stage and the N+1-th stage may share the second pull down control circuit.

In an embodiment, the N-th stage may include a scan gate output circuit. The scan gate output circuit may include a sixth transistor to apply an N-th scan clock signal to a scan gate output node in response to the QN node, an eighth transistor to apply a second low voltage to the scan gate output node in response to the QBN node and a first capacitor connected between a control electrode of the sixth transistor and the scan gate output node.

In an embodiment, the N-th stage may further include a sensing gate output circuit. The sensing gate output circuit may include a ninth transistor to apply an N-th sensing clock signal to a sensing gate output node in response to the QN node, an eleventh transistor to apply the second low voltage to the sensing gate output node in response to the QBN node and a second capacitor connected between a control electrode of the ninth transistor and the sensing gate output node.

In an embodiment, the N-th stage may further include a carry output circuit. The carry output circuit may include a twelfth transistor to apply an N-th carry clock signal to a carry output node in response to the QN node and a fourteenth transistor to apply a first low voltage to the carry output node in response to the QBN node.

In an embodiment, the scan gate output circuit may further include an 8-2 transistor to apply the second low voltage to the scan gate output node in response to a next carry signal which is one of carry signals of next stages. The sensing gate output circuit may further include an 11-2 transistor to apply the second low voltage to the sensing gate output node in response to the next carry signal. The carry output circuit may further include a 14-2 transistor to apply the first low voltage to the carry output node in response to the next carry signal.

In an embodiment, the scan gate output circuit may further include an 8-2 transistor to apply the second low voltage to the scan gate output node in response to a next carry signal which is one of carry signals of next stages. The sensing gate output circuit may further include an 11-2 transistor to apply the second low voltage to the sensing gate output node in response to the next carry signal.

In an embodiment, the N-th stage may include a scan gate output circuit, a sensing gate output circuit and a carry output circuit. The scan gate output circuit may include a sixth transistor to apply an N-th scan clock signal to a scan gate output node in response to the QN node, an eighth transistor to apply a second low voltage to the scan gate output node in response to the QBN node and a first capacitor connected between a control electrode of the sixth transistor and the scan gate output node. The sensing gate output circuit may include a ninth transistor to apply the N-th scan clock signal to a sensing gate output node in response to the QN node, an eleventh transistor to apply the second low voltage to the sensing gate output node in response to the QBN node and second capacitor connected between a control electrode of the ninth transistor and the sensing gate output node. The carry output circuit may include a twelfth transistor to apply an N-th carry clock signal to a carry output node in response to the QN node and a fourteenth transistor to apply a first low voltage to the carry output node in response to the QBN node.

In an embodiment, the scan gate output circuit may further include an 8-2 transistor to apply the second low voltage to the scan gate output node in response to a next carry signal which is one of carry signals of next stages. The carry output circuit may further include a 14-2 transistor to apply the first low voltage to the carry output node in response to the next carry signal.

In an embodiment, the scan gate output circuit may further include an 8-2 transistor to apply the second low voltage to the scan gate output node in response to a next carry signal which is one of carry signals of next stages.

In an embodiment of a display apparatus according to the present disclosure, the display apparatus includes a display panel, a gate driver and a data driver. A gate driving circuit of the gate driver includes an N-th stage and an N+1-th stage. The N-th stage outputs an N-th scan gate signal based on an N-th scan clock signal, a voltage of a QN node and a voltage of a QBN node and to output an N-th carry signal based on an N-th carry clock signal, the voltage of the QN node and the voltage of the QBN node. The N+1-th stage outputs an N+1-th scan gate signal based on an N+1-th scan clock signal, a voltage of a QN+1 node and the voltage of the QBN node and an N+1-th carry signal based on an N+1-th carry clock signal, the voltage of the QN+1 node and the voltage of the QBN node. The N-th stage and the N+1-th stage share an inverting circuit. The inverting circuit controls the QBN node based on a third signal. N is a positive integer.

According to the gate driving circuit and the display apparatus, the N-th stage and the N+1-th stage may share the QBN node and share a portion of circuits so that the number of the transistors in the gate driving circuit and the number of the signal lines may be greatly reduced. Thus, the dead space of the display apparatus may be reduced.

In addition, at least one of the scan gate output circuit, the sensing gate output circuit and the carry output circuit includes the transistor for enhancing a falling time so that a falling time of at least one of the scan gate signal, the sensing gate signal and the carry signal may be enhanced so that the display quality of the display panel may be enhanced.

In addition, the scan gate output circuit may include the transistor for enhancing the falling time and the sensing gate output circuit may not include the transistor for enhancing the falling time so that the falling time of the sensing gate signal may be delayed than the falling time of the scan gate signal. Thus, the display quality of the display panel may be enhanced.

BRIEF DESCRIPTION OF THE DRAWINGS

The above and other features and advantages of the present disclosure will become more apparent by describing in detailed embodiments thereof with reference to the accompanying drawings, in which.

DETAILED DESCRIPTION OF THE DISCLOSURE

Hereinafter, the present disclosure will be explained in detail with reference to the accompanying drawings.

Figure 1:
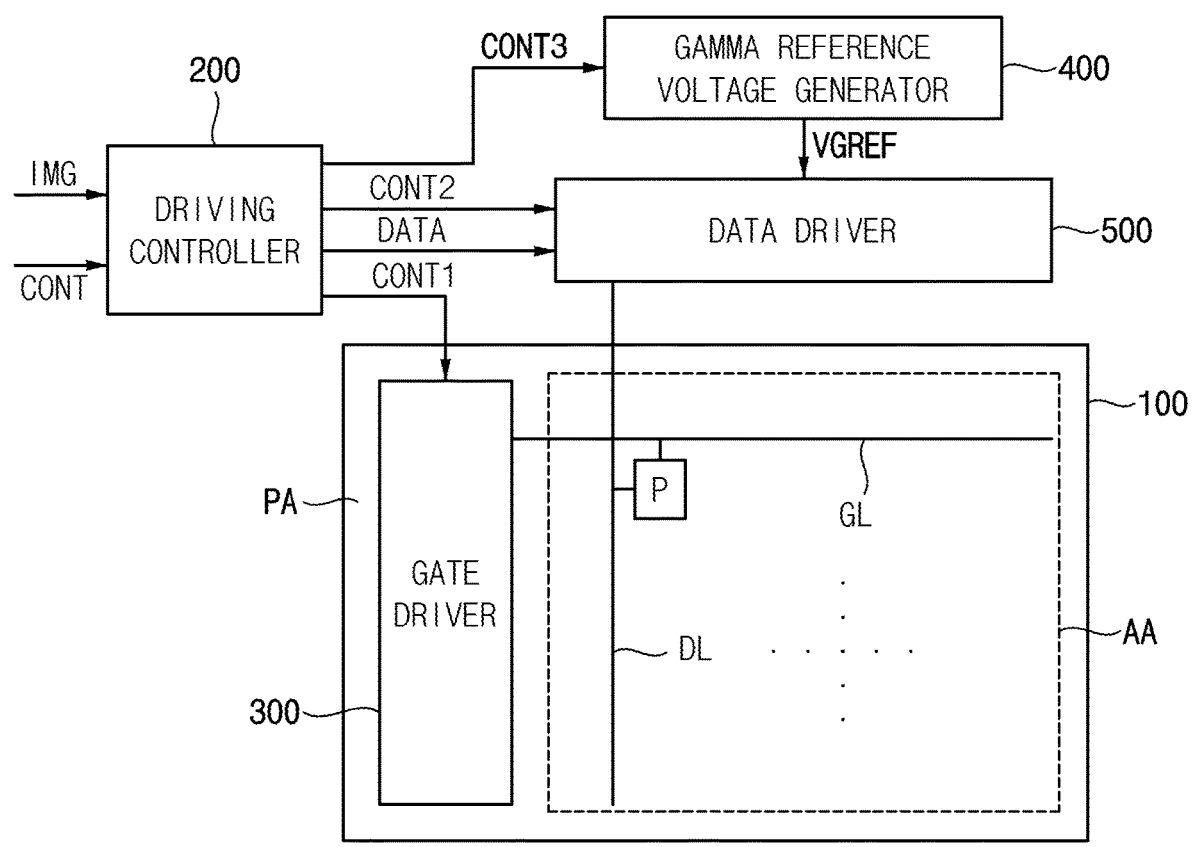
FIG. 1 is a block diagram illustrating a display apparatus according to an embodiment of the present disclosure.

FIG. 1 is a block diagram illustrating a display apparatus according to an embodiment of the present disclosure.

Referring to FIG. 1, the display apparatus includes a display panel 100 and a display panel driver. The display panel driver includes a driving controller 200, a gate driver 300, a gamma reference voltage generator 400 and a data driver 500.

For example, the driving controller 200 and the data driver 500 may be integrally formed. For example, the driving controller 200, the gamma reference voltage generator 400, and the data driver 500 may be integrally formed. A driving module including at least the driving controller 200 and the data driver 500 which are integrally formed may be called as a timing controller embedded data driver (TED).

The display panel 100 includes a display region AA on which an image is displayed and a peripheral region PA adjacent to the display region AA.

The display panel 100 includes a plurality of gate lines GL, a plurality of data lines DL, and a plurality of pixels connected to the gate lines GL and the data lines DL. The gate lines GL may extend in a first direction D1 and the data lines DL may extend in a second direction D2 crossing the first direction D1.

The driving controller 200 receives input image data IMG and an input control signal CONT from an external apparatus. The input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a gate control signal CONT1, a data control signal CONT2, a gamma control signal CONT3 and a data signal DATA based on the input image data IMG and the input control signal CONT.

The driving controller 200 generates the gate control signal CONT1 for controlling an operation of the gate driver 300 based on the input control signal CONT, and outputs the gate control signal CONT1 to the gate driver 300. The gate control signal CONT1 may further include a vertical start signal and a gate clock signal.

The driving controller 200 generates the data control signal CONT2 for controlling an operation of the data driver 500 based on the input control signal CONT, and outputs the data control signal CONT2 to the data driver 500. The data control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the gamma control signal CONT3 for controlling an operation of the gamma reference voltage generator 400 based on the input control signal CONT, and outputs the gamma control signal CONT3 to the gamma reference voltage generator 400.

The gate driver 300 generates gate signals driving the gate lines GL in response to the gate control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the peripheral region PA of the display panel 100. For example, the gate driver 300 may be integrated on the peripheral region PA of the display panel 100.

The gamma reference voltage generator 400 generates a gamma reference voltage VGREF in response to the gamma control signal CONT3 received from the driving controller 200. The gamma reference voltage generator 400 provides the gamma reference voltage VGREF to the data driver 500.

In an embodiment, the gamma reference voltage generator 400 may be disposed in the driving controller 200, or in the data driver 500.

The data driver 500 receives the data control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

Figure 2:
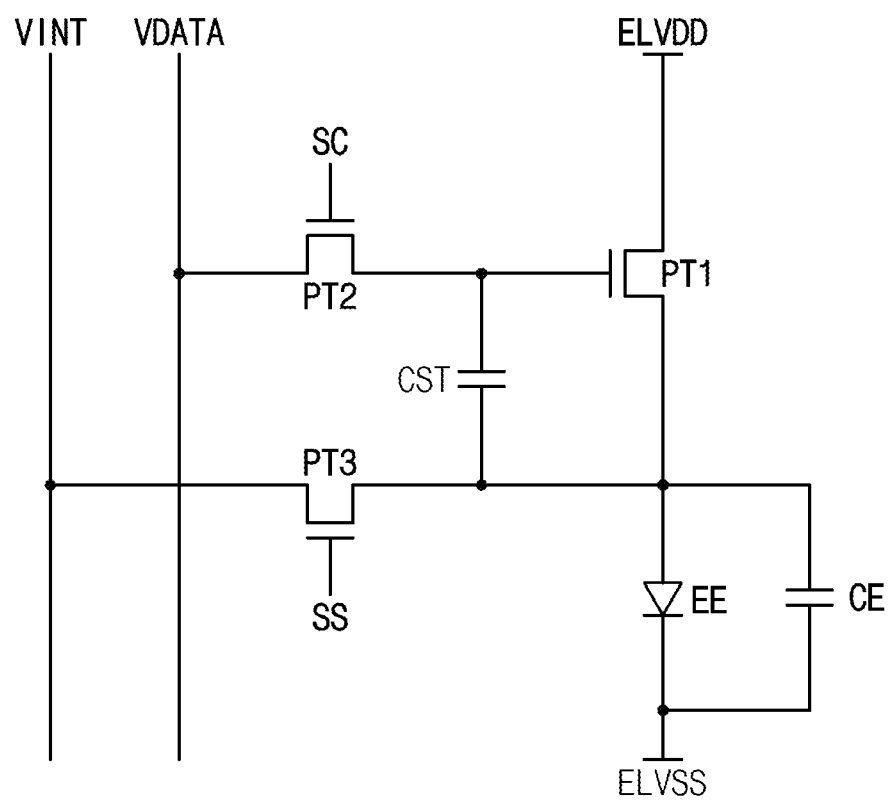
FIG. 2 is a circuit diagram illustrating a pixel of a display panel of FIG. 1.

FIG. 2 is a circuit diagram illustrating the pixel P of the display panel 100 of FIG. 1.

Referring to FIGS. 1 and 2, the pixel P may include a first pixel switching element PT1, a second pixel switching element PT2, a third pixel switching element PT3, a light emitting element EE, and a storage capacitor CST.

The first pixel switching element PT1 may include a control electrode connected to the storage capacitor CST, a first electrode receiving a high power voltage ELVDD, and a second electrode connected to the light emitting element EE.

The second pixel switching element PT2 may include a control electrode receiving a scan gate signal SC, a first electrode receiving the data voltage VDATA, and a second electrode connected to the control electrode of the first pixel switching element PT1.

The third pixel switching element PT3 may include a control electrode receiving a sensing gate signal SS, a first electrode receiving an initialization voltage VINT, and a second electrode connected to a second electrode of the light emitting element EE.

The light emitting element EE may include a first electrode connected to the second electrode of the first pixel switching element PT1 and a second electrode receiving a low power voltage ELVSS.

The storage capacitor CST may include a first electrode connected to the control electrode of the first pixel switching element PT1 and a second electrode connected to the second electrode of the first pixel switching element PT1.

The pixel P may further include a light emitting element capacitor CE including a first electrode connected to the first electrode of the light emitting element EE and a second electrode connected to the second electrode of the light emitting element EE. The light emitting element capacitor CE may mean an internal capacitance of the light emitting element EE.

When the scan gate signal SC is activated, the second pixel switching element PT2 is turned on so that the data voltage VDATA may be applied to the control electrode of the first pixel switching element PT1.

When the sensing gate signal SS is activated, the third pixel switching element PT3 is turned on so that the initialization voltage VINT may be applied to the second electrode of the first pixel switching element PT1.

The data voltage VDATA and the initialization voltage VINT are applied to the control electrode and the second electrode of the first pixel switching element PT1 respectively and the initialization voltage VINT has a constant level so that a luminance of the light emitting element EE may be determined by a level of the data voltage VDATA.

Figure 3:
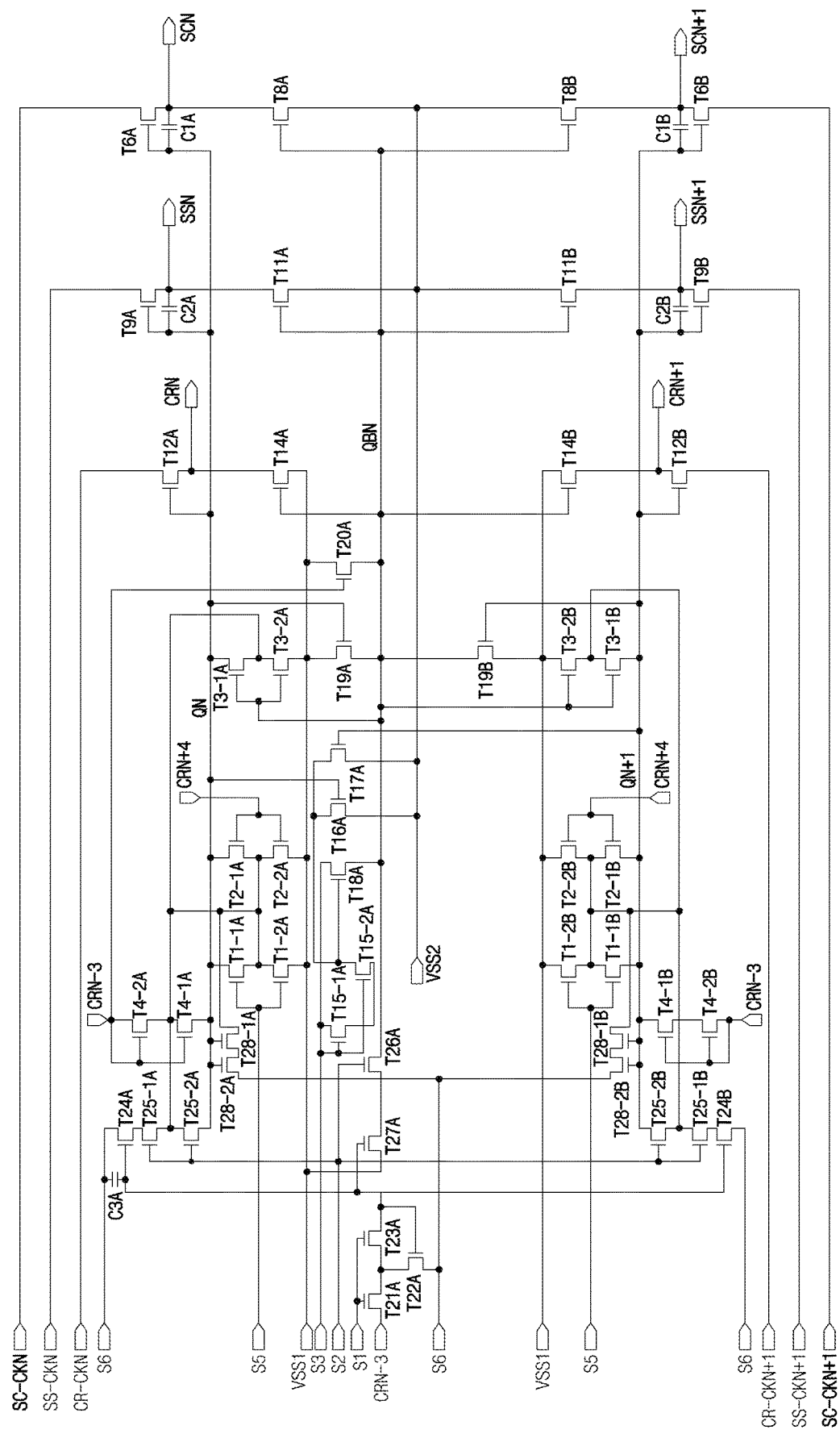
FIG. 3 is a circuit diagram illustrating a gate driving circuit of a gate driver of FIG. 1.
Figure 4:
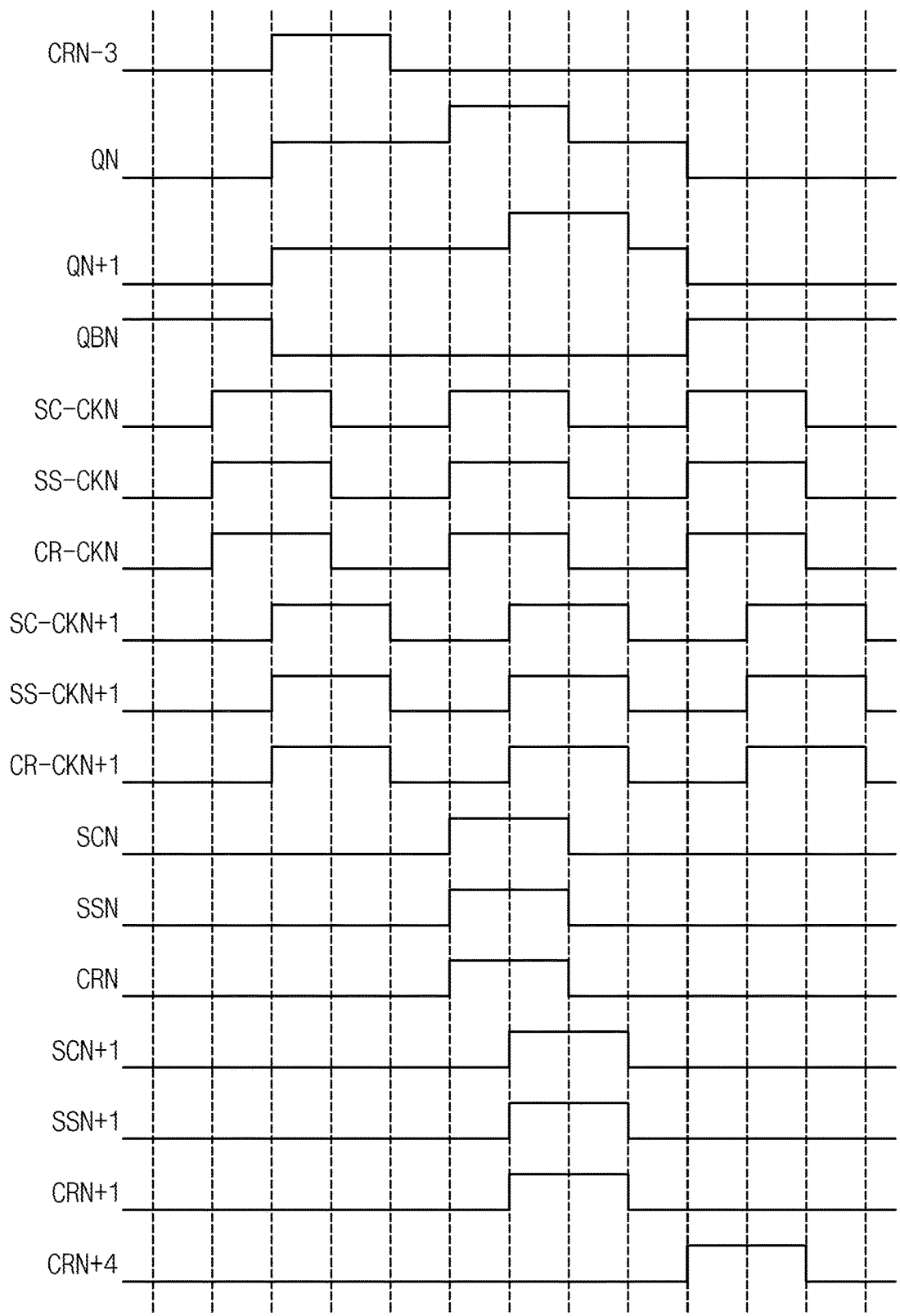
FIG. 4 is a timing diagram illustrating input signals, node signals and output signals of the gate driving circuit of FIG. 3.
Figure 5:
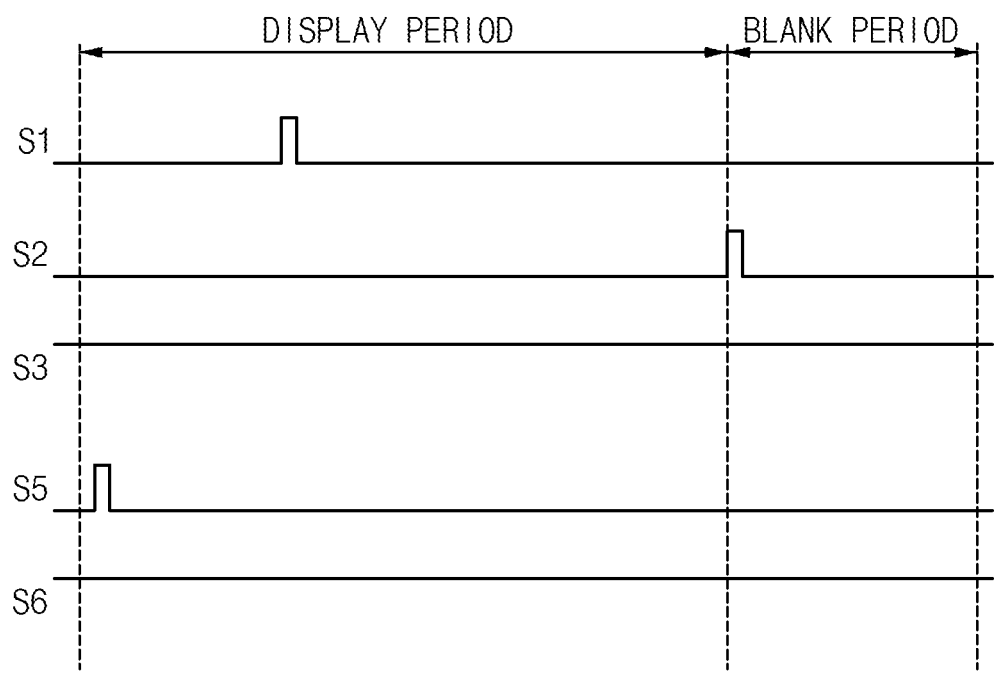
FIG. 5 is a timing diagram illustrating some input signals of the gate driving circuit of FIG. 3.

FIG. 3 is a circuit diagram illustrating a gate driving circuit of the gate driver 300 of FIG. 1. FIG. 4 is a timing diagram illustrating input signals, node signals and output signals of the gate driving circuit of FIG. 3. FIG. 5 is a timing diagram illustrating some input signals of the gate driving circuit of FIG. 3;

Referring to FIGS. 1, 2, 3, 4, and 5, the gate driving circuit may include a plurality of stages. For example, a first stage of the gate driving circuit may output a gate signal corresponding to a first gate line and a second stage of the gate driving circuit may output a gate signal corresponding to a second gate line.

The gate driving circuit may include an N-th stage and an N+1-th stage. The N-th stage may output an N-th scan gate signal SCN based on an N-th scan clock signal SC-CKN, a voltage of a QN node and a voltage of a QBN node and an N-th carry signal CRN based on an N-th carry clock signal CR-CKN, the voltage of the QN node, and the voltage of the QBN node. The N+1-th stage may output an N+1-th scan gate signal SCN+1 based on an N+1-th scan clock signal SC-CKN+1, a voltage of a QN+1 node and the voltage of the QBN node and an N+1-th carry signal CRN+1 based on an N+1-th carry clock signal CR-CKN+1, the voltage of the QN+1 node and the voltage of the QBN node. Herein, N is a positive integer.

In the present embodiment, the N-th stage may output an N-th sensing gate signal SSN based on an N-th sensing clock signal SS-CKN, the voltage of the QN node and the voltage of the QBN node. In addition, the N+1-th stage may output an N+1-th sensing gate signal SSN+1 based on an N+1-th sensing clock signal SS-CKN+1, the voltage of the QN+1 node and the voltage of the QBN node.

That is, the N-th stage and the N+1-th stage may include Q nodes (QN and QN+1) respectively and may share a QB node (QBN).

In the present embodiment, the N-th stage and the N+1-th stage may share an inverting circuit. The inverting circuit may control the QBN node based on a third signal S3. As shown in FIG. 5, the third signal S3 may be a direct-current (DC) signal having a constant high level.

The inverting circuit may include a 15-1 transistor T15-1A, a 15-2 transistor T15-2A and an eighteenth transistor T18A.

The 15-1 transistor T15-1A may include a control electrode receiving the third signal S3, a first electrode receiving the third signal S3, and a second electrode connected to a second electrode of the 15-2 transistor T15-2A.

The 15-2 transistor T15-2A may include a control electrode receiving the third signal S3, a first electrode connected to a control electrode of the eighteenth transistor T18A, and the second electrode connected to the second electrode of the 15-1 transistor T15-1A.

The eighteenth transistor T18A may include the control electrode connected to the first electrode of the 15-2 transistor T15-2A, a first electrode receiving the third signal S3, and a second electrode connected to the QBN node.

The inverting circuit may further include a sixteenth transistor T16A and a seventeenth transistor T17A.

The sixteenth transistor T16A may apply a second low voltage VSS2 to the control electrode of the eighteenth transistor T18A in response to the QN node. The seventeenth transistor T17A may apply the second low voltage VSS2 to the control electrode of the eighteenth transistor T18A in response to the QN+1 node.

The sixteenth transistor T16A may include a control electrode connected to the QN node, a first electrode receiving the second low voltage VSS2, and a second electrode connected to the control electrode of the eighteenth transistor T18A.

The seventeenth transistor T17A may include a control electrode connected to the QN+1 node, a first electrode receiving the second low voltage VSS2, and a second electrode connected to the control electrode of the eighteenth transistor T18A.

In addition, the N-th stage and the N+1-th stage may share a first sensing circuit. The first sensing circuit may include a twenty first transistor T21A, a twenty second transistor T22A, and a twenty third transistor T23A.

The twenty first transistor T21A may include a control electrode receiving a first signal S1, a first electrode receiving a previous carry signal (e.g. CRN-3) which is one of carry signals of previous stages, and a second electrode connected to a second electrode of the twenty second transistor T22A. As shown in FIG. 5, the first signal S1 may have one active pulse in a display period and a gate line which is a sensing target may be selected by the active pulse of the first signal S1.

Although the previous carry signal is the carry signal CRN-3 of a third previous stage in the present embodiment, the present disclosure may not be limited thereto.

The twenty third transistor T23A may include a control electrode receiving the first signal S1, a first electrode connected to the second electrode of the twenty first transistor T21A, and a second electrode connected to a control electrode of the twenty second transistor T22A.

The twenty second transistor T22A may include the control electrode connected to the second electrode of the twenty third transistor T23A, a first electrode receiving a sixth signal S6, and the second electrode connected to the second electrode of the twenty first transistor T21A. As shown in FIG. 5, the sixth signal S6 may be a direct-current (DC) signal having a constant high level.

The first sensing circuit may further include a twenty sixth transistor T26A and a twenty seventh transistor T27A.

The twenty sixth transistor T26A may include a control electrode receiving a second signal S2, a first electrode connected to a second electrode of the twenty seventh transistor T27A, and a second electrode connected to the QBN node. As shown in FIG. 5, the second signal S2 may have one active pulse at a beginning of a blank period. When the second signal S2 has the active pulse, a gate signal may be applied to the sensing target gate line which is selected by the first signal S1.

The twenty seventh transistor T27A may include a control electrode connected to the second electrode of the twenty third transistor T23A, a first electrode receiving a first low voltage VSS1, and the second electrode connected to the first electrode of the twenty sixth transistor T26A.

The N-th stage may include a second sensing circuit. The second sensing circuit of the N-th stage may include a twenty fourth transistor T24A, a 25-1 transistor T25-1A, a 25-2 transistor T25-2A, and a third capacitor C3A.

The twenty fourth transistor T24A of the N-th stage may include a control electrode connected to the second electrode of the twenty third transistor T23A, a first electrode receiving the sixth signal S6, and a second electrode connected to a first electrode of the 25-1 transistor T25-1A of the N-th stage.

The 25-1 transistor T25-1A of the N-th stage may include a control electrode receiving the second signal S2, the first electrode connected to the second electrode of the twenty fourth transistor T24A of the N-th stage, and a second electrode connected to a first electrode of the 25-2 transistor T25-2A of the N-th stage.

The 25-2 transistor T25-2A of the N-th stage may include a control electrode receiving the second signal S2, the first electrode connected to the second electrode of the 25-1 transistor T25-1A of the N-th stage, and a second electrode connected to the QN node.

The third capacitor C3A may include a first electrode receiving the sixth signal S6 and a second electrode connected to the control electrode of the twenty fourth transistor T24A of the N-th stage.

The N+1-th stage may include a second sensing circuit. The second sensing circuit of the N+1-th stage may include a twenty fourth transistor T24B, a 25-1 transistor T25-1B and a 25-2 transistor T25-2B. As shown in FIG. 3, the N+1-th stage may not include the third capacitor. That is, the second sensing circuit of the N-th stage and the second sensing circuit of the N+1-th stage may share the third capacitor C3A.

The third capacitor C3A may store a voltage of a high level when a corresponding stage is selected as the sensing target by the first signal S1.

The N-th stage may include a first pull up control circuit. The first pull up control circuit may output the previous carry signal CRN-3 to the QN node in response to the previous carry signal CRN-3.

For example, the first pull up control circuit may include a 4-1 transistor T4-1A and a 4-2 transistor T4-2A.

The 4-2 transistor T4-2A may include a control electrode receiving the previous carry signal CRN-3, a first electrode receiving the previous carry signal CRN-3, and a second electrode connected to a first electrode of the 4-1 transistor T4-1A.

The 4-1 transistor T4-1A may include a control electrode receiving the previous carry signal CRN-3, a first electrode connected to the second electrode of the 4-2 transistor T4-2A, and a second electrode connected to the QN node.

The N-th stage may further include a second pull up control circuit. The second pull up control circuit may output the first low voltage VSS1 to the QN node in response to a next carry signal (e.g. CRN+4) which is one of carry signals of next stages.

Although the next carry signal is the carry signal CRN+4 of a fourth next stage in the present embodiment, the present disclosure may not be limited thereto.

For example, the second pull up control circuit may include a 2-1 transistor T2-1A and a 2-2 transistor T2-2A. Although the second pull up control circuit includes two transistors T2-1A and T2-2A which are connected to each other in series to prevent a leakage in the present embodiment, the present disclosure may not be limited thereto. Alternatively, the second pull up control circuit may include only one transistor or three or more transistors which are connected to each other in series.

The 2-1 transistor T2-1A may include a control electrode receiving the next carry signal CRN+4, a first electrode connected to a second electrode of the 2-2 transistor T2-2A, and a second electrode connected to the QN node.

The 2-2 transistor T2-2A may include a control electrode receiving the next carry signal CRN+4, a first electrode receiving the first low voltage VSS1, and the second electrode connected to the first electrode of the 2-1 transistor T2-1A.

The N-th stage may further include a third pull up control circuit. The third pull up control circuit may output the first low voltage VSS1 to the QN node in response to the voltage of the QBN node.

For example, the third pull up control circuit may include a 3-1 transistor T3-1A and a 3-2 transistor T3-2A. Although the third pull up control circuit includes two transistors T3-1A and T3-2A which are connected to each other in series to prevent a leakage in the present embodiment, the present disclosure may not be limited thereto. Alternatively, the third pull up control circuit may include only one transistor or three or more transistors which are connected to each other in series.

The 3-1 transistor T3-1A may include a control electrode connected to the QBN node, a first electrode connected to a second electrode of the 3-2 transistor T3-2A, and a second electrode connected to the QN node.

The 3-2 transistor T3-2A may include a control electrode connected to the QBN node, a first electrode receiving the first low voltage VSS1, and the second electrode connected to the first electrode of the 3-1 transistor T3-1A.

The N-th stage may include a first pull down control circuit. The first pull down control circuit may output the first low voltage VSS1 to the QBN node in response to the voltage of the QN node.

For example, the first pull down control circuit may include a nineteenth transistor T19A. The nineteenth transistor T19A may include a control electrode connected to the QN node, a first electrode receiving the first low voltage VSS1, and a second electrode connected to the QBN node.

The N-th stage may further include a second pull down control circuit. The second pull down control circuit may output the first low voltage VSS1 to the QBN node in response to the previous carry signal CRN-3.

For example, the second pull down control circuit may include a twentieth transistor T20A. The twentieth transistor T20A may include a control electrode receiving the previous carry signal CRN-3, a first electrode receiving the first low voltage VSS1, and a second electrode connected to the QBN node.

In the present embodiment, the N-th stage and the N+1-th stage may share the second pull down control circuit.

The N-th stage may include a scan gate output circuit. The scan gate output circuit may include a sixth transistor T6A applying the N-th scan clock signal SC-CKN to a scan gate output node in response to the QN node, an eighth transistor T8A applying the second low voltage VSS2 to the scan gate output node in response to the QBN node and a first capacitor C1A connected between a control electrode of the sixth transistor T6A and the scan gate output node. When the N-th scan clock signal SC-CKN has a high level, the first capacitor C1A may boost the QN node.

The N-th stage may further include a sensing gate output circuit. The sensing gate output circuit may include a ninth transistor T9A applying the N-th sensing clock signal SS-CKN to a sensing gate output node in response to the QN node, an eleventh transistor T11A applying the second low voltage VSS2 to the sensing gate output node in response to the QBN node and a second capacitor C2A connected between a control electrode of the ninth transistor T9A and the sensing gate output node. When the N-th sensing clock signal SS-CKN has a high level, the second capacitor C2A may boost the QN node.

The N-th stage may further include a carry output circuit. The carry output circuit may include a twelfth transistor T12A applying the N-th carry clock signal CR-CKN to a carry output node in response to the QN node and a fourteenth transistor T14A applying the first low voltage VSS1 to the carry output node in response to the QBN node.

The N-th stage may further include a reset circuit. The reset circuit may output the first low voltage VSS1 to the QN node in response to a fifth signal S5. As shown in FIG. 5, the fifth signal S5 may have one active pulse at a beginning of the display period. For example, the fifth signal S5 may be the vertical start signal. In this case, the timing of the fifth signal S5 is different from the timing of the first signal S1. When the fifth signal S5 has the active pulse at the beginning of the display period, the QN node may be reset to the first low voltage VSS1 by the reset circuit.

For example, the reset circuit may include a 1-1 transistor T1-1A and a 1-2 transistor T1-2A. Although the reset circuit includes two transistors T1-1A and T1-2A which are connected to each other in series to prevent a leakage in the present embodiment, the present disclosure may not be limited thereto. Alternatively, the reset circuit may include only one transistor or three or more transistors which are connected to each other in series.

The N-th stage may further include a stabilizing circuit. The stabilizing circuit may apply the high voltage (e.g. the sixth signal S6) to intermediate nodes of the two transistors connected to each other in series to prevent the leakage so that an efficiency of leakage prevention of the two transistors connected to each other in series may be enhanced.

The stabilizing circuit may include a 28-1 transistor T28-1A and a 28-2 transistor T28-2A. Although the stabilizing circuit includes two transistors T28-1A and T28-2A which are connected to each other in series to prevent a leakage in the present embodiment, the present disclosure may not be limited thereto. Alternatively, the stabilizing circuit may include only one transistor or three or more transistors which are connected to each other in series.

For example, an output electrode of the stabilizing circuit may be connected to an intermediate node between the 1-1 transistor T1-1A and the 1-2 transistor T1-2A, an intermediate node between the 2-1 transistor T2-1A and the 2-2 transistor T2-2A, an intermediate node between the 3-1 transistor T3-1A and the 3-2 transistor T3-2A, an intermediate node between the 4-1 transistor T4-1A and the 4-2 transistor T4-2A, and an intermediate node between the 25-1 transistor T25-1A and the 25-2 transistor T25-2A.

As explained above, the N-th stage and the N+1-th stage may share the inverting circuit T15-1A, T15-2A, T16A, T17A, and T18A, the first sensing circuit T21A, T22A, T23A, T26A, and T27A, and the third capacitor C3A of the second sensing circuit and the second pull down control circuit T20A.

The N+1-th stage may include elements substantially the same as all of the elements of the N-th stage except for the inverting circuit T15-1A, T15-2A, T16A, T17A, and T18A, the first sensing circuit T21A, T22A, T23A, T26A, and T27A, and the third capacitor C3A of the second sensing circuit and the second pull down control circuit T20A.

Referring to FIG. 4, when the previous carry signal CRN-3 has a high level, the voltage of the QN node and the voltage of the QN+1 node may rise to a first high level by the first pull up control circuit T4-1A, T4-2A, T4-1B, and T4-2B.

When the N-th scan clock signal SC-CKN and the N-th sensing clock signal SS-CKN have the high level, the QN node is boosted by the first capacitor C1A and the second capacitor C2A of the N-th stage so that the voltage of the QN node may rise to a second high level.

During a time period when the voltage of the QN node has the high level, a pulse of the N-th scan gate signal SCN may be outputted by the N-th scan clock signal SC-CKN, a pulse of the N-th sensing gate signal SSN may be outputted by the N-th sensing clock signal SS-CKN and a pulse of the N-th carry signal CRN may be outputted by the N-th carry clock signal CR-CKN.

When the N+1-th scan clock signal SC-CKN+1 and the N+1-th sensing clock signal SS-CKN+1 have the high level, the QN+1 node is boosted by the first capacitor C1B and the second capacitor C2B of the N+1-th stage so that the voltage of the QN+1 node may rise to a second high level.

During a time period when the voltage of the QN+1 node has the high level, a pulse of the N+1-th scan gate signal SCN+1 may be outputted by the N+1-th scan clock signal SC-CKN+1, a pulse of the N+1-th sensing gate signal SSN+1 may be outputted by the N+1-th sensing clock signal SS-CKN+1 and a pulse of the N+1-th carry signal CRN+1 may be outputted by the N+1-th carry clock signal CR-CKN+1.

During the time period when the voltage of the QN node has the first high level or the second high level, the QBN node may have a low level.

When the next carry signal CRN+4 has a high level, the voltage of the QN node and the voltage of the QN+1 node may fall to a low level by the second pull up control circuit T2-1A, T2-2A, T2-1B, and T2-2B.

According to the present embodiment, the N-th stage and the N+1-th stage may share the QBN node and share the portion of circuits so that the number of the transistors in the gate driving circuit and the number of the signal lines may be reduced. Thus, the dead space of the display apparatus may be reduced.

Figure 6:
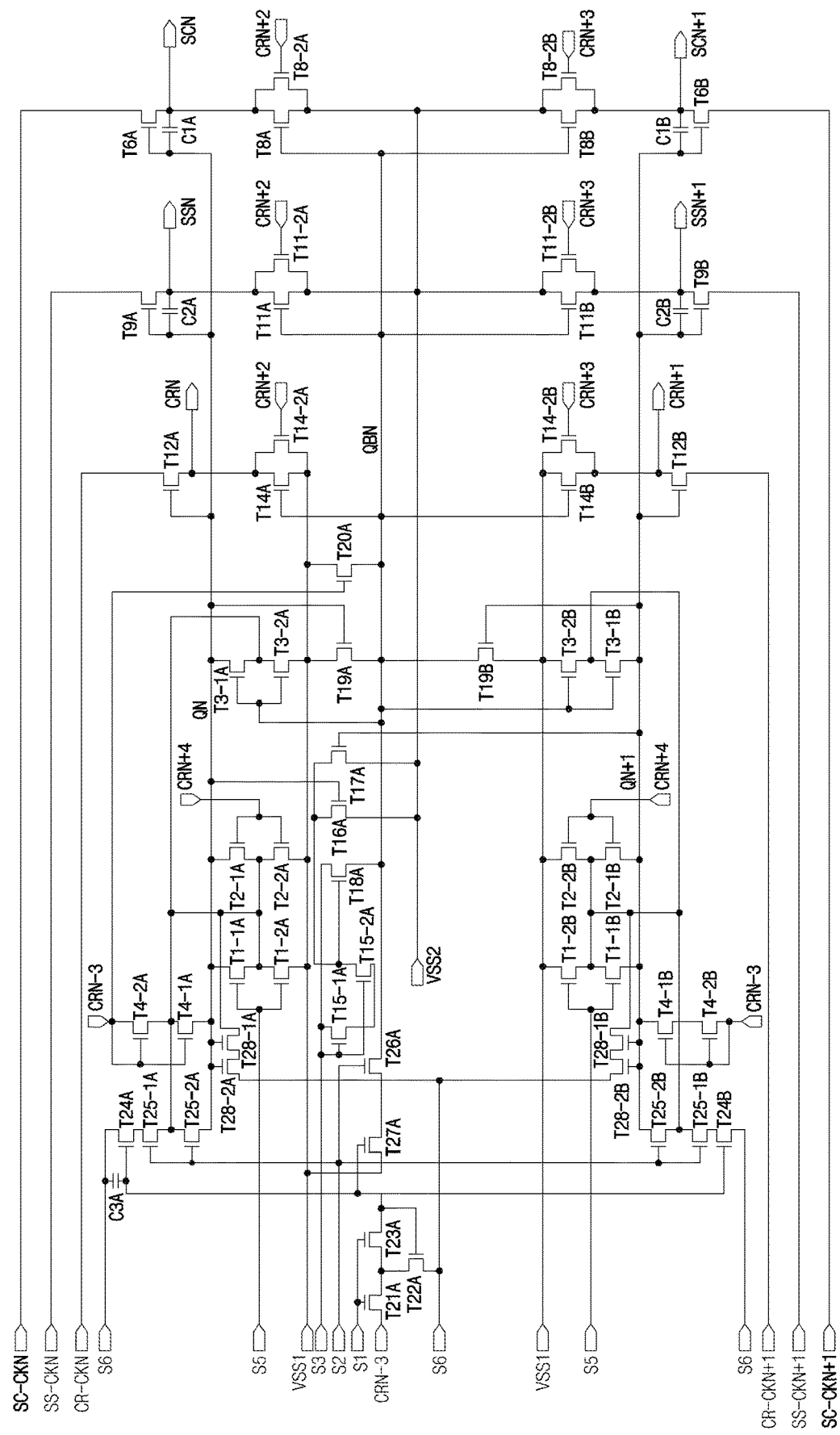
FIG. 6 is a circuit diagram illustrating a gate driving circuit of a gate driver of a display apparatus according to an embodiment of the present disclosure.
Figure 7A:
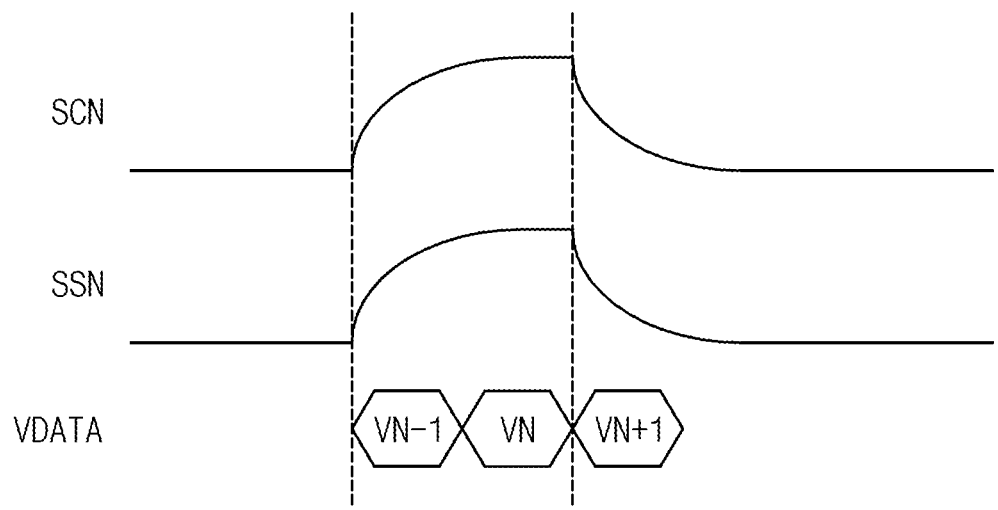
FIG. 7A is a timing diagram illustrating a scan gate signal, a sensing gate signal and a data voltage of a comparative embodiment.
Figure 7B:
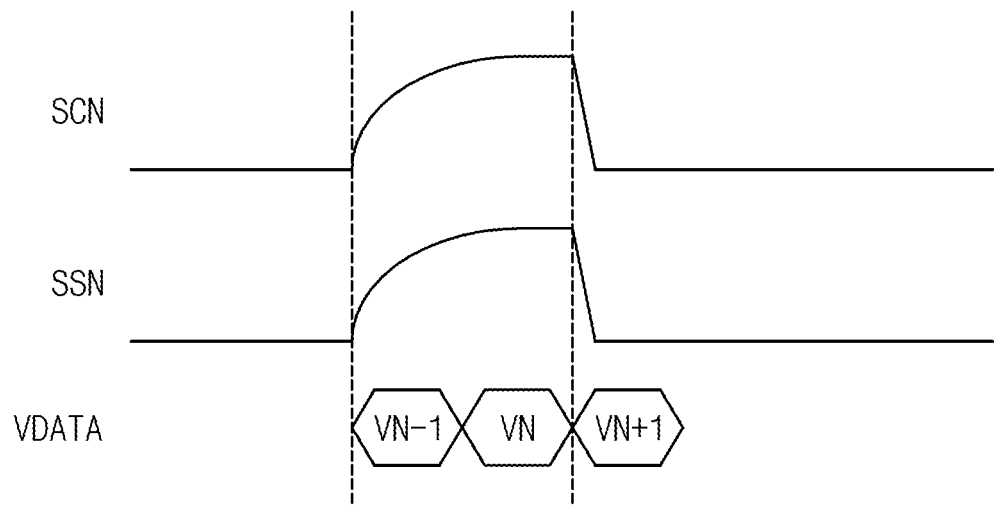
FIG. 7B is a timing diagram illustrating a scan gate signal, a sensing gate signal and a data voltage of a present embodiment.

FIG. 6 is a circuit diagram illustrating a gate driving circuit of a gate driver 300 of a display apparatus according to an embodiment of the present disclosure. FIG. 7A is a timing diagram illustrating a scan gate signal SCN, a sensing gate signal SSN, and a data voltage VDATA of a comparative embodiment. FIG. 7B is a timing diagram illustrating a scan gate signal SCN, a sensing gate signal SSN, and a data voltage VDATA of a present embodiment.

The gate driver and the display apparatus according to the present embodiment are substantially the same as the gate driver and the display apparatus of the previous embodiment explained referring to FIGS. 1, 2, 3, 4, and 5 except for the structures of the scan gate output circuit, the sensing gate output circuit and the carry output circuit. Thus, the same reference numerals will be used to refer to the same or like parts as those described in the previous embodiment of FIGS. 1, 2, 3, 4, and 5, and any repetitive explanation concerning the above elements will be omitted.

Referring to FIGS. 1, 2, 4, 5, 6, and 7B, the display apparatus includes a display panel 100 and a display panel driver. The display panel driver includes a driving controller 200, a gate driver 300, a gamma reference voltage generator 400, and a data driver 500.

The gate driving circuit may include a plurality of stages. For example, a first stage of the gate driving circuit may output a gate signal corresponding to a first gate line and a second stage of the gate driving circuit may output a gate signal corresponding to a second gate line.

The gate driving circuit may include an N-th stage and an N+1-th stage. The N-th stage may output an N-th scan gate signal SCN based on an N-th scan clock signal SC-CKN, a voltage of a QN node and a voltage of a QBN node and an N-th carry signal CRN based on an N-th carry clock signal CR-CKN, the voltage of the QN node, and the voltage of the QBN node. The N+1-th stage may output an N+1-th scan gate signal SCN+1 based on an N+1-th scan clock signal SC-CKN+1, a voltage of a QN+1 node, and the voltage of the QBN node and an N+1-th carry signal CRN+1 based on an N+1-th carry clock signal CR-CKN+1, the voltage of the QN+1 node, and the voltage of the QBN node. Herein, N is a positive integer.

In the present embodiment, the N-th stage may output an N-th sensing gate signal SSN based on an N-th sensing clock signal SS-CKN, the voltage of the QN node, and the voltage of the QBN node. In addition, the N+1-th stage may output an N+1-th sensing gate signal SSN+1 based on an N+1-th sensing clock signal SS-CKN+1, the voltage of the QN+1 node, and the voltage of the QBN node.

That is, the N-th stage and the N+1-th stage may include Q nodes (QN and QN+1) respectively and may share a QB node (QBN).

In the present embodiment, the N-th stage and the N+1-th stage may share an inverting circuit T15-1A, T15-2A, T16A, T17A, and T18A. The inverting circuit may control the QBN node based on a third signal S3.

In addition, the N-th stage and the N+1-th stage may share a first sensing circuit T21A, T22A, T23A, T26A, and T27A. A second sensing circuit of the N-th stage and a second sensing circuit of the N+1-th stage may share the third capacitor C3A. In addition, the N-th stage and the N+1-th stage may share the second pull down control circuit T20A.

The N-th stage may include a scan gate output circuit. The scan gate output circuit may include a sixth transistor T6A applying the N-th scan clock signal SC-CKN to a scan gate output node in response to the QN node, an eighth transistor T8A applying the second low voltage VSS2 to the scan gate output node in response to the QBN node and a first capacitor C1A connected between a control electrode of the sixth transistor T6A and the scan gate output node. When the N-th scan clock signal SC-CKN has a high level, the first capacitor C1A may boost the QN node.

The N-th stage may further include a sensing gate output circuit. The sensing gate output circuit may include a ninth transistor T9A applying the N-th sensing clock signal SS-CKN to a sensing gate output node in response to the QN node, an eleventh transistor T11A applying the second low voltage VSS2 to the sensing gate output node in response to the QBN node, and a second capacitor C2A connected between a control electrode of the ninth transistor T9A and the sensing gate output node. When the N-th sensing clock signal SS-CKN has a high level, the second capacitor C2A may boost the QN node.

The N-th stage may further include a carry output circuit. The carry output circuit may include a twelfth transistor T12A applying the N-th carry clock signal CR-CKN to a carry output node in response to the QN node and a fourteenth transistor T14A applying the first low voltage VSS1 to the carry output node in response to the QBN node.

In the present embodiment, the scan gate output circuit may further include an 8-2 transistor T8-2A applying the second low voltage VSS2 to the scan gate output node in response to a second next carry signal (e.g. CRN+2) which is one of carry signals of next stages.

In addition, the sensing gate output circuit may further include an 11-2 transistor T11-2A applying the second low voltage VSS2 to the sensing gate output node in response to the second next carry signal (e.g. CRN+2).

In addition, the carry output circuit may further include a 14-2 transistor T14-2A applying the first low voltage VSS1 to the carry output node in response to the second next carry signal (e.g. CRN+2).

As shown in FIG. 7A, falling characteristics of the scan gate signal SCN and the sensing gate signal SSN may be deteriorated by loads. When falling delays of the scan gate signal SCN and the sensing gate signal SSN occur, a data voltage VN+1 of an N+1-th pixel row instead of a data voltage VN of an N-th pixel row may be erroneously charged in the N-th pixel row so that a display defect may be generated.

In the present embodiment, to enhance the falling characteristics of the scan gate signal SCN and the sensing gate signal SSN, the gate driving circuit may further include the 8-2 transistor T8-2A applying the second low voltage VSS2 to the scan gate output node in response to the second next carry signal (e.g. CRN+2) and the 11-2 transistor T11-2A applying the second low voltage VSS2 to the sensing gate output node in response to the second next carry signal (e.g. CRN+2).

In addition, when a falling delay of the carry signal increases, a defect of an operation of the gate driving circuit may be generated. To enhance a falling characteristic of the carry signal CRN, the gate driving circuit may further include the 14-2 transistor T14-2A applying the first low voltage VSS1 to the carry output node in response to the second next carry signal (e.g. CRN+2).

As shown in FIG. 7B, the falling characteristics of the scan gate signal SCN and the sensing gate signal SSN may be enhanced by the 8-2 transistor T8-2A and the 11-2 transistor T11-2A so that the display defect in which the data voltage VN+1 of the N+1-th pixel row instead of the data voltage VN of the N-th pixel row is erroneously charged in the N-th pixel row may be prevented.

As shown in FIG. 6, the second next carry signal for enhancing the falling characteristics of the N-th stage may be CRN+2 and the second next carry signal for enhancing the falling characteristics of the N+1-th stage may be CRN+3.

Like the N-th stage, the N+1-th stage may further include an 8-2 transistor T8-2B for enhancing a falling characteristic of the scan gate signal SCN+1, an 11-2 transistor T11-2B for enhancing a falling characteristic of the sensing gate signal SSN+1, and a 14-2 transistor T14-2B for enhancing a falling characteristic of the carry signal CRN+1.

According to the present embodiment, the N-th stage and the N+1-th stage may share the QBN node and share the portion of circuits so that the number of the transistors in the gate driving circuit and the number of the signal lines may be greatly reduced. Thus, the dead space of the display apparatus may be reduced.

In addition, at least one of the scan gate output circuit, the sensing gate output circuit and the carry output circuit includes the transistor for enhancing a falling time so that a falling time of at least one of the scan gate signal, the sensing gate signal and the carry signal may be enhanced so that the display quality of the display panel may be enhanced.

Figure 8:
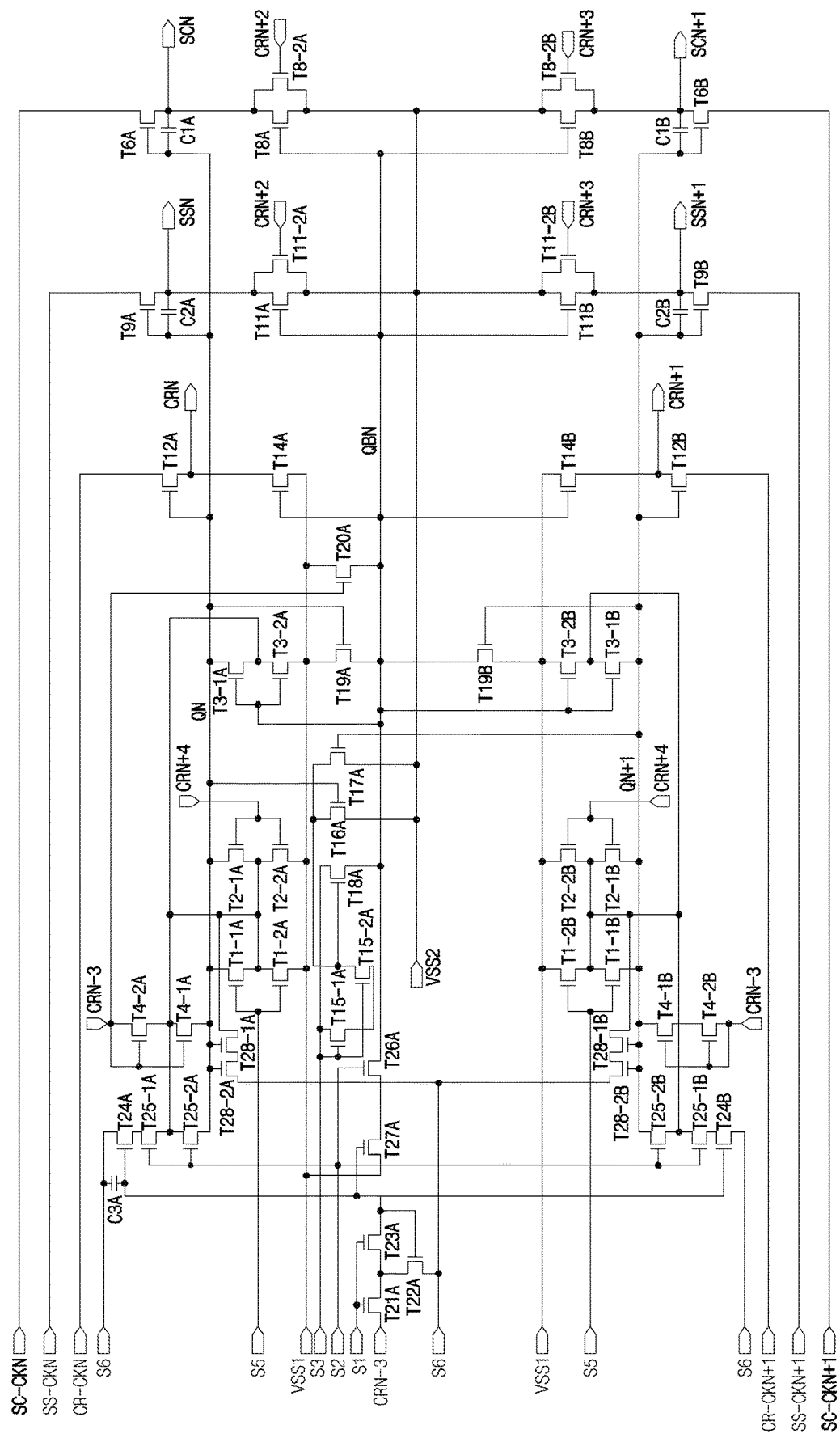
FIG. 8 is a circuit diagram illustrating a gate driving circuit of a gate driver of a display apparatus according to an embodiment of the present disclosure.

FIG. 8 is a circuit diagram illustrating a gate driving circuit of a gate driver 300 of a display apparatus according to an embodiment of the present disclosure.

The gate driver and the display apparatus according to the present embodiment are substantially the same as the gate driver and the display apparatus of the previous embodiment explained referring to FIGS. 1 to 5 except for the structures of the scan gate output circuit and the sensing gate output circuit. Thus, the same reference numerals will be used to refer to the same or like parts as those described in the previous embodiment of FIGS. 1 to 5 and any repetitive explanation concerning the above elements will be omitted.

Referring to FIGS. 1, 2, 4, 5 and 7A to 8, the display apparatus includes a display panel 100 and a display panel driver. The display panel driver includes a driving controller 200, a gate driver 300, a gamma reference voltage generator 400 and a data driver 500.

The gate driving circuit may include a plurality of stages. For example, a first stage of the gate driving circuit may output a gate signal corresponding to a first gate line and a second stage of the gate driving circuit may output a gate signal corresponding to a second gate line.

The gate driving circuit may include an N-th stage and an N+1-th stage. The N-th stage may output an N-th scan gate signal SCN based on an N-th scan clock signal SC-CKN, a voltage of a QN node and a voltage of a QBN node and an N-th carry signal CRN based on an N-th carry clock signal CR-CKN, the voltage of the QN node and the voltage of the QBN node. The N+1-th stage may output an N+1-th scan gate signal SCN+1 based on an N+1-th scan clock signal SC-CKN+1, a voltage of a QN+1 node and the voltage of the QBN node and an N+1-th carry signal CRN+1 based on an N+1-th carry clock signal CR-CKN+1, the voltage of the QN+1 node and the voltage of the QBN node. Herein, N is a positive integer.

In the present embodiment, the N-th stage may output an N-th sensing gate signal SSN based on an N-th sensing clock signal SS-CKN, the voltage of the QN node and the voltage of the QBN node. In addition, the N+1-th stage may output an N+1-th sensing gate signal SSN+1 based on an N+1-th sensing clock signal SS-CKN+1, the voltage of the QN+1 node and the voltage of the QBN node.

That is, the N-th stage and the N+1-th stage may include Q nodes (QN and QN+1) respectively and may share a QB node (QBN).

In the present embodiment, the N-th stage and the N+1-th stage may share an inverting circuit T15-1A, T15-2A, T16A, T17A and T18A. The inverting circuit may control the QBN node based on a third signal S3.

In addition, the N-th stage and the N+1-th stage may share a first sensing circuit T21A, T22A, T23A, T26A and T27A. A second sensing circuit of the N-th stage and a second sensing circuit of the N+1-th stage may share the third capacitor C3A. In addition, the N-th stage and the N+1-th stage may share the second pull down control circuit T20A.

The N-th stage may include a scan gate output circuit. The scan gate output circuit may include a sixth transistor T6A applying the N-th scan clock signal SC-CKN to a scan gate output node in response to the QN node, an eighth transistor T8A applying the second low voltage VSS2 to the scan gate output node in response to the QBN node and a first capacitor C1A connected between a control electrode of the sixth transistor T6A and the scan gate output node. When the N-th scan clock signal SC-CKN has a high level, the first capacitor C1A may boost the QN node.

The N-th stage may further include a sensing gate output circuit. The sensing gate output circuit may include a ninth transistor T9A applying the N-th sensing clock signal SS-CKN to a sensing gate output node in response to the QN node, an eleventh transistor T11A applying the second low voltage VSS2 to the sensing gate output node in response to the QBN node and a second capacitor C2A connected between a control electrode of the ninth transistor T9A and the sensing gate output node. When the N-th sensing clock signal SS-CKN has a high level, the second capacitor C2A may boost the QN node.

The N-th stage may further include a carry output circuit. The carry output circuit may include a twelfth transistor T12A applying the N-th carry clock signal CR-CKN to a carry output node in response to the QN node and a fourteenth transistor T14A applying the first low voltage VSS1 to the carry output node in response to the QBN node.

In the present embodiment, the scan gate output circuit may further include an 8-2 transistor T8-2A applying the second low voltage VSS2 to the scan gate output node in response to a second next carry signal (e.g. CRN+2) which is one of carry signals of next stages.

In addition, the sensing gate output circuit may further include an 11-2 transistor T11-2A applying the second low voltage VSS2 to the sensing gate output node in response to the second next carry signal (e.g. CRN+2).

As shown in FIG. 7A, falling characteristics of the scan gate signal SCN and the sensing gate signal SSN may be deteriorated by loads. When falling delays of the scan gate signal SCN and the sensing gate signal SSN occur, a data voltage VN+1 of an N+1-th pixel row instead of a data voltage VN of an N-th pixel row may be erroneously charged in the N-th pixel row so that a display defect may be generated.

In the present embodiment, to enhance the falling characteristics of the scan gate signal SCN and the sensing gate signal SSN, the gate driving circuit may further include the 8-2 transistor T8-2A applying the second low voltage VSS2 to the scan gate output node in response to the second next carry signal (e.g. CRN+2) and the 11-2 transistor T11-2A applying the second low voltage VSS2 to the sensing gate output node in response to the second next carry signal (e.g. CRN+2).

As shown in FIG. 7B, the falling characteristics of the scan gate signal SCN and the sensing gate signal SSN may be enhanced by the 8-2 transistor T8-2A and the 11-2 transistor T11-2A so that the display defect in which the data voltage VN+1 of the N+1-th pixel row instead of the data voltage VN of the N-th pixel row is erroneously charged in the N-th pixel row may be prevented. That is, the falling characteristics of the scan gate signal SCN and the sensing gate signal SSN may instantaneously fall at the beginning of the N-th pixel row.

As shown in FIG. 8, the second next carry signal for enhancing the falling characteristics of the N-th stage may be CRN+2 and the second next carry signal for enhancing the falling characteristics of the N+1-th stage may be CRN+3.

Like the N-th stage, the N+1-th stage may further include an 8-2 transistor T8-2B for enhancing a falling characteristic of the scan gate signal SCN+1 and an 11-2 transistor T11-2B for enhancing a falling characteristic of the sensing gate signal SSN+1.

According to the present embodiment, the N-th stage and the N+1-th stage may share the QBN node and share the portion of circuits so that the number of the transistors in the gate driving circuit and the number of the signal lines may be greatly reduced. Thus, the dead space of the display apparatus may be reduced.

In addition, at least one of the scan gate output circuit, the sensing gate output circuit and the carry output circuit includes the transistor for enhancing a falling time so that a falling time of at least one of the scan gate signal, the sensing gate signal and the carry signal may be enhanced so that the display quality of the display panel may be enhanced.

Figure 9:
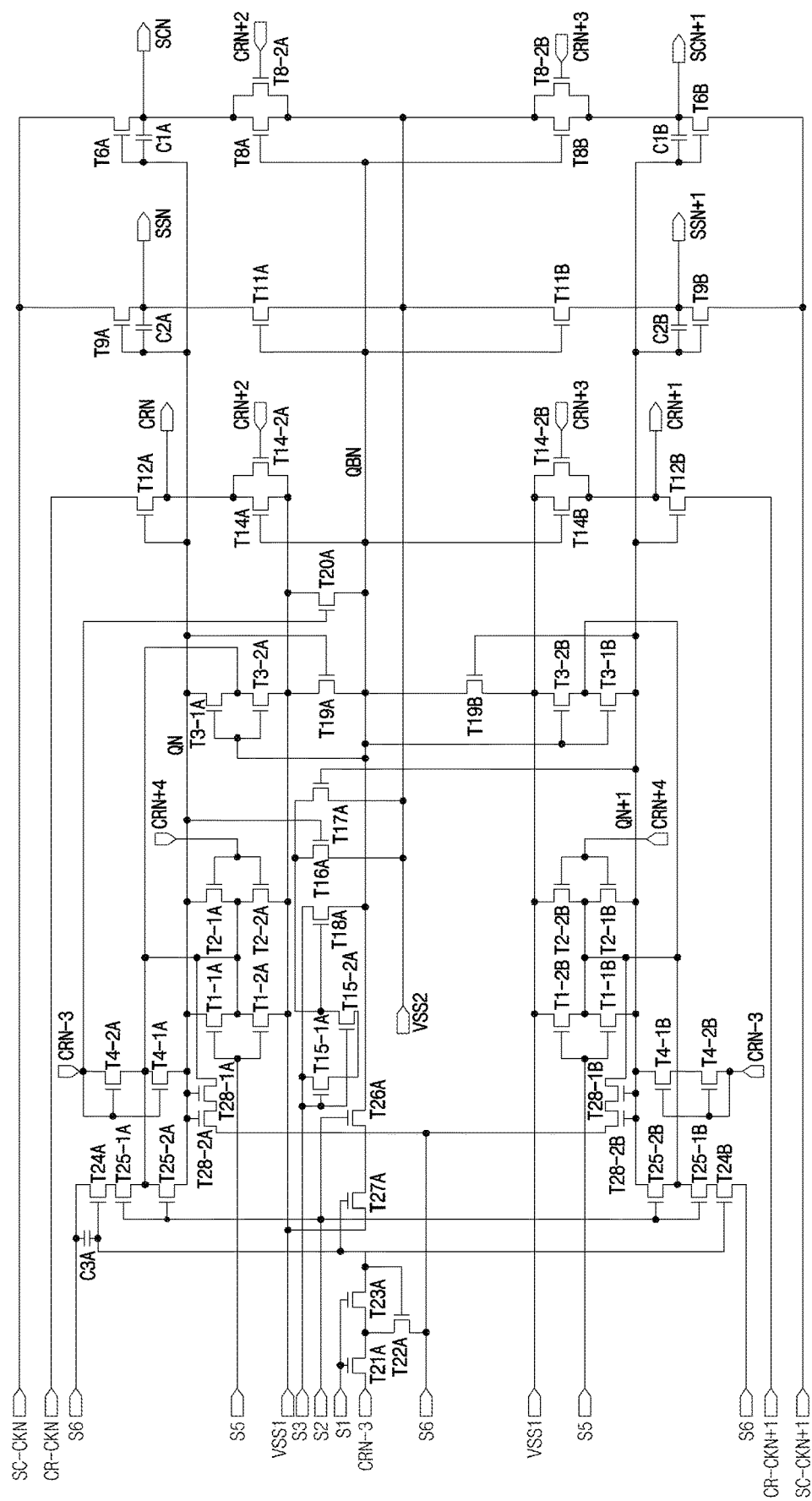
FIG. 9 is a circuit diagram illustrating a gate driving circuit of a gate driver of a display apparatus according to an embodiment of the present disclosure.
Figure 10A:
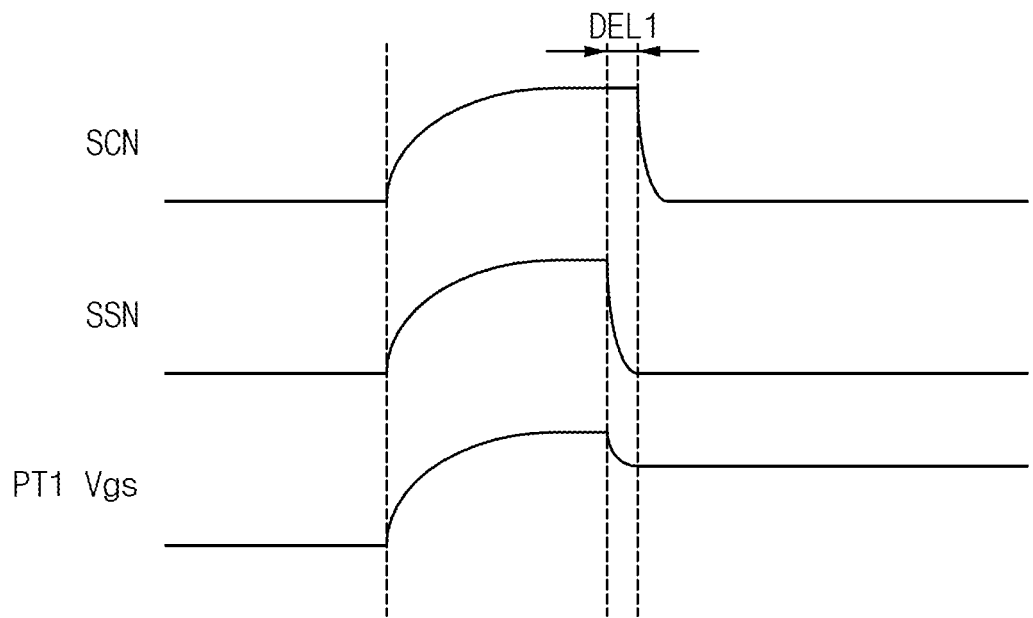
FIG. 10A is a timing diagram illustrating a scan gate signal, a sensing gate signal and a gate-source voltage of a first pixel switching element of a comparative embodiment.
Figure 10B:
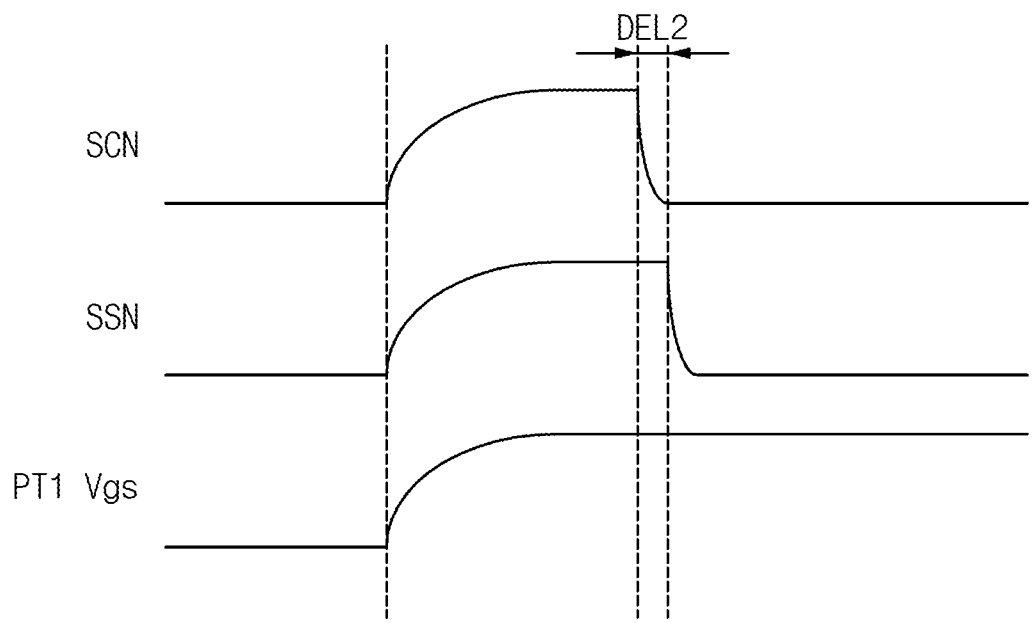
FIG. 10B is a timing diagram illustrating a scan gate signal, a sensing gate signal and a gate-source voltage of a first pixel switching element of a present embodiment.

FIG. 9 is a circuit diagram illustrating a gate driving circuit of a gate driver of a display apparatus according to an embodiment of the present disclosure. FIG. 10A is a timing diagram illustrating a scan gate signal SCN, a sensing gate signal SSN, and a gate-source voltage of a first pixel switching element PT1 of a comparative embodiment. FIG. 10B is a timing diagram illustrating a scan gate signal SCN, a sensing gate signal SSN, and a gate-source voltage of a first pixel switching element PT1 of a present embodiment.

The gate driver and the display apparatus according to the present embodiment are substantially the same as the gate driver and the display apparatus of the previous embodiment explained referring to FIGS. 1, 2, 3, 4, and 5 except for the structures of the scan gate output circuit, the sensing gate output circuit, and the carry output circuit. Thus, the same reference numerals will be used to refer to the same or like parts as those described in the previous embodiment of FIGS. 1, 2, 3, 4, and 5, and any repetitive explanation concerning the above elements will be omitted.

Referring to FIGS. 1, 2, 4, 5, 9, and 10B, the display apparatus includes a display panel 100 and a display panel driver. The display panel driver includes a driving controller 200, a gate driver 300, a gamma reference voltage generator 400, and a data driver 500.

The gate driving circuit may include a plurality of stages. For example, a first stage of the gate driving circuit may output a gate signal corresponding to a first gate line and a second stage of the gate driving circuit may output a gate signal corresponding to a second gate line.

The gate driving circuit may include an N-th stage and an N+1-th stage. The N-th stage may output an N-th scan gate signal SCN based on an N-th scan clock signal SC-CKN, a voltage of a QN node, and a voltage of a QBN node and an N-th carry signal CRN based on an N-th carry clock signal CR-CKN, the voltage of the QN node, and the voltage of the QBN node. The N+1-th stage may output an N+1-th scan gate signal SCN+1 based on an N+1-th scan clock signal SC-CKN+1, a voltage of a QN+1 node, and the voltage of the QBN node and an N+1-th carry signal CRN+1 based on an N+1-th carry clock signal CR-CKN+1, the voltage of the QN+1 node, and the voltage of the QBN node. Herein, N is a positive integer.

In the present embodiment, a sensing clock signal may not be applied to the gate driving circuit. In the present embodiment, the scan gate signal SCN and SCN+1 and the sensing gate signal SSN and SSN+1 may be generated based on the scan clock signal SC-CKN and SC-CKN+1.

The N-th stage may output an N-th sensing gate signal SSN based on the N-th scan clock signal SC-CKN, the voltage of the QN node, and the voltage of the QBN node. In addition, the N+1-th stage may output an N+1-th sensing gate signal SSN+1 based on the N+1-th scan clock signal SC-CKN+1, the voltage of the QN+1 node, and the voltage of the QBN node.

That is, the N-th stage and the N+1-th stage may include Q nodes (QN and QN+1) respectively and may share a QB node (QBN).

In the present embodiment, the N-th stage and the N+1-th stage may share an inverting circuit T15-1A, T15-2A, T16A, T17A, and T18A. The inverting circuit may control the QBN node based on a third signal S3.

In addition, the N-th stage and the N+1-th stage may share a first sensing circuit T21A, T22A, T23A, T26A, and T27A. A second sensing circuit of the N-th stage and a second sensing circuit of the N+1-th stage may share the third capacitor C3A. In addition, the N-th stage and the N+1-th stage may share the second pull down control circuit T20A.

The N-th stage may include a scan gate output circuit, a sensing gate output circuit and a carry output circuit.

The scan gate output circuit may include a sixth transistor T6A applying the N-th scan clock signal SC-CKN to a scan gate output node in response to the QN node, an eighth transistor T8A applying the second low voltage VSS2 to the scan gate output node in response to the QBN node and a first capacitor C1A connected between a control electrode of the sixth transistor T6A and the scan gate output node.

The sensing gate output circuit may include a ninth transistor T9A applying the N-th scan clock signal SC-CKN to a sensing gate output node in response to the QN node, an eleventh transistor T11A applying the second low voltage VSS2 to the sensing gate output node in response to the QBN node and a second capacitor C2A connected between a control electrode of the ninth transistor T9A and the sensing gate output node.

The carry output circuit may include a twelfth transistor T12A applying the N-th carry clock signal CR-CKN to a carry output node in response to the QN node and a fourteenth transistor T14A applying the first low voltage VSS1 to the carry output node in response to the QBN node.

Generally, the scan gate signal SCN and the sensing gate signal SSN may be designed such that the scan gate signal SCN and the sensing gate signal SSN rise in the same timing and fall in the same timing.

As shown in FIG. 10A, due to an influence of kickback or a load difference, the sensing gate signal SSN may fall first, and the scan gate signal SCN may fall after a predetermined delay time DELL In this case, a period when the second pixel switching element PT2 of FIG. 2 is turned on but the third pixel switching element PT3 of FIG. 2 is turned off may occur.

In the period when the second pixel switching element PT2 is turned on but the third pixel switching element PT3 is turned off, a voltage level of the first electrode of the light emitting element EE may change, and accordingly, the gate-source voltage (Vgs) of the first pixel switching element PT1 may decrease. When the gate-source voltage (Vgs) of the first pixel switching element PT1 decreases, an image may be darker so that a horizontal line defect may occur on the display panel 100.

Thus, as shown in FIG. 10B, the falling timing of the sensing gate signal SSN may be set to be later than the falling timing of the scan gate signal SCN by a predetermined time DEL2. Thus, the period when the second pixel switching element PT2 is turned on but the third pixel switching element PT3 is turned off may not occur so that the gate-source voltage (Vgs) of the first pixel switching element PT1 may not decrease. Therefore, the horizontal line defect may be prevented on the display panel 100.

In the present embodiment, the scan gate output circuit may further include an 8-2 transistor T8-2A applying the second low voltage VSS2 to the scan gate output node in response to the second next carry signal CRN+2 but the sensing gate output circuit may not include an 11-2 transistor (T11-2A in FIG. 6) applying the second low voltage VSS2 to the scan gate output node in response to the second next carry signal CRN+2. By doing this, the falling timing of the sensing gate signal SSN may be set to be later than the falling timing of the scan gate signal SCN by the predetermined time DEL2.

In addition, as explained referring to FIG. 6, the carry output circuit may further include a 14-2 transistor T14-2A applying the first low voltage VSS1 to the carry output node in response to the second next carry signal (e.g. CRN+2) so that the falling characteristic of the carry signal CRN may be enhanced.

As shown in FIG. 9, the second next carry signal for enhancing the falling characteristics of the N-th stage may be CRN+2 and the second next carry signal for enhancing the falling characteristics of the N+1-th stage may be CRN+3.

Like the N-th stage, the N+1-th stage may further include an 8-2 transistor T8-2B for enhancing a falling characteristic of the scan gate signal SCN+1 and a 14-2 transistor T14-2B for enhancing a falling characteristic of the carry signal CRN+1.

According to the present embodiment, the N-th stage and the N+1-th stage may share the QBN node and share the portion of circuits so that the number of the transistors in the gate driving circuit and the number of the signal lines may be greatly reduced. Thus, the dead space of the display apparatus may be reduced.

In addition, at least one of the scan gate output circuit, the sensing gate output circuit and the carry output circuit includes the transistor for enhancing a falling time so that a falling time of at least one of the scan gate signal, the sensing gate signal and the carry signal may be enhanced so that the display quality of the display panel may be enhanced.

In addition, the scan gate output circuit may include the transistor T8-2A and T8-2B for enhancing the falling time and the sensing gate output circuit may not include the transistor T11-2A and T11-2B for enhancing the falling time so that the falling time of the sensing gate signal may be delayed than the falling time of the scan gate signal. Thus, the display quality of the display panel 100 may be enhanced.

Figure 11:
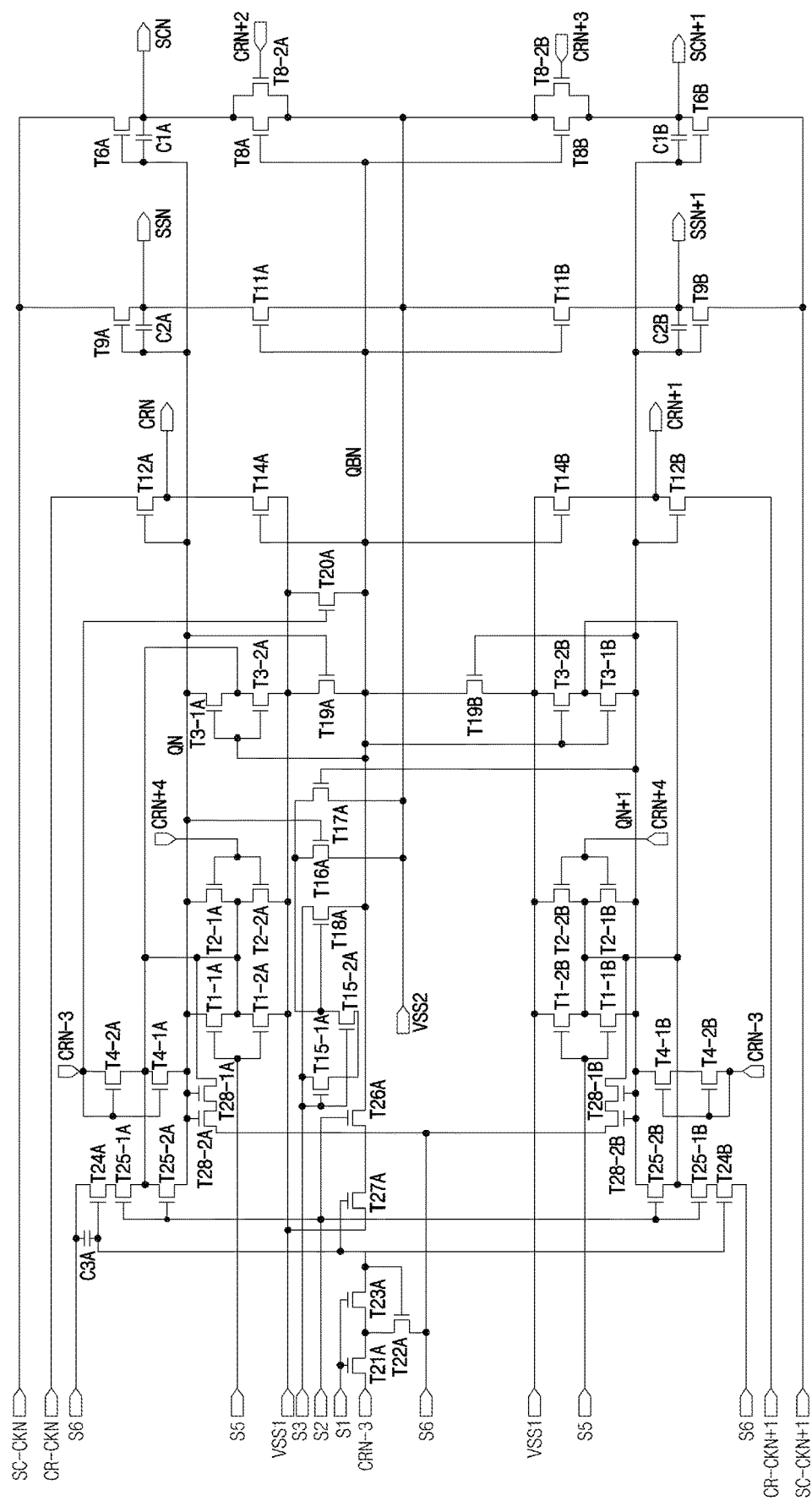
FIG. 11 is a circuit diagram illustrating a gate driving circuit of a gate driver of a display apparatus according to an embodiment of the present disclosure.

FIG. 11 is a circuit diagram illustrating a gate driving circuit of a gate driver 300 of a display apparatus according to an embodiment of the present disclosure.

The gate driver and the display apparatus according to the present embodiment are substantially the same as the gate driver and the display apparatus of the previous embodiment explained referring to FIGS. 1, 2, 3, 4, and 5 except for the structures of the scan gate output circuit, the sensing gate output circuit and the carry output circuit. Thus, the same reference numerals will be used to refer to the same or like parts as those described in the previous embodiment of FIGS. 1 to 5 and any repetitive explanation concerning the above elements will be omitted.

Referring to FIGS. 1, 2, 4, 5, 10B, and 11, the display apparatus includes a display panel 100 and a display panel driver. The display panel driver includes a driving controller 200, a gate driver 300, a gamma reference voltage generator 400 and a data driver 500.

The gate driving circuit may include a plurality of stages. For example, a first stage of the gate driving circuit may output a gate signal corresponding to a first gate line and a second stage of the gate driving circuit may output a gate signal corresponding to a second gate line.

The gate driving circuit may include an N-th stage and an N+1-th stage. The N-th stage may output an N-th scan gate signal SCN based on an N-th scan clock signal SC-CKN, a voltage of a QN node and a voltage of a QBN node and an N-th carry signal CRN based on an N-th carry clock signal CR-CKN, the voltage of the QN node and the voltage of the QBN node. The N+1-th stage may output an N+1-th scan gate signal SCN+1 based on an N+1-th scan clock signal SC-CKN+1, a voltage of a QN+1 node and the voltage of the QBN node and an N+1-th carry signal CRN+1 based on an N+1-th carry clock signal CR-CKN+1, the voltage of the QN+1 node and the voltage of the QBN node. Herein, N is a positive integer.

In the present embodiment, a sensing clock signal may not be applied to the gate driving circuit. In the present embodiment, the scan gate signal SCN and SCN+1 and the sensing gate signal SSN and SSN+1 may be generated based on the scan clock signal SC-CKN and SC-CKN+1.

The N-th stage may output an N-th sensing gate signal SSN based on the N-th scan clock signal SC-CKN, the voltage of the QN node and the voltage of the QBN node. In addition, the N+1-th stage may output an N+1-th sensing gate signal SSN+1 based on the N+1-th scan clock signal SC-CKN+1, the voltage of the QN+1 node and the voltage of the QBN node.

That is, the N-th stage and the N+1-th stage may include Q nodes (QN and QN+1) respectively and may share a QB node (QBN).

In the present embodiment, the N-th stage and the N+1-th stage may share an inverting circuit T15-1A, T15-2A, T16A, T17A, and T18A. The inverting circuit may control the QBN node based on a third signal S3.

In addition, the N-th stage and the N+1-th stage may share a first sensing circuit T21A, T22A, T23A, T26A, and T27A. A second sensing circuit of the N-th stage and a second sensing circuit of the N+1-th stage may share the third capacitor C3A. In addition, the N-th stage and the N+1-th stage may share the second pull down control circuit T20A.

The N-th stage may include a scan gate output circuit, a sensing gate output circuit and a carry output circuit.

The scan gate output circuit may include a sixth transistor T6A applying the N-th scan clock signal SC-CKN to a scan gate output node in response to the QN node, an eighth transistor T8A applying the second low voltage VSS2 to the scan gate output node in response to the QBN node and a first capacitor C1A connected between a control electrode of the sixth transistor T6A and the scan gate output node.

The sensing gate output circuit may include a ninth transistor T9A applying the N-th scan clock signal SC-CKN to a sensing gate output node in response to the QN node, an eleventh transistor T11A applying the second low voltage VSS2 to the sensing gate output node in response to the QBN node and a second capacitor C2A connected between a control electrode of the ninth transistor T9A and the sensing gate output node.

The carry output circuit may include a twelfth transistor T12A applying the N-th carry clock signal CR-CKN to a carry output node in response to the QN node and a fourteenth transistor T14A applying the first low voltage VSS1 to the carry output node in response to the QBN node.

Generally, the scan gate signal SCN and the sensing gate signal SSN may be designed such that the scan gate signal SCN and the sensing gate signal SSN rise in the same timing and fall in the same timing.

As shown in FIG. 10A, due to an influence of kickback or a load difference, the sensing gate signal SSN may fall first, and the scan gate signal SCN may fall after a predetermined delay time DEL1. In this case, a period when the second pixel switching element PT2 of FIG. 2 is turned on but the third pixel switching element PT3 of FIG. 2 is turned off may occur.

In the period when the second pixel switching element PT2 is turned on but the third pixel switching element PT3 is turned off, a voltage level of the first electrode of the light emitting element EE may change, and accordingly, the gate-source voltage (Vgs) of the first pixel switching element PT1 may decrease. When the gate-source voltage (Vgs) of the first pixel switching element PT1 decreases, an image may be darker so that a horizontal line defect may occur on the display panel 100.

Thus, as shown in FIG. 10B, the falling timing of the sensing gate signal SSN may be set to be later than the falling timing of the scan gate signal SCN by a predetermined time DEL2.

In the present embodiment, the scan gate output circuit may further include an 8-2 transistor T8-2A applying the second low voltage VSS2 to the scan gate output node in response to the second next carry signal CRN+2 but the sensing gate output circuit may not include an 11-2 transistor (T11-2A in FIG. 6) applying the second low voltage VSS2 to the scan gate output node in response to the second next carry signal CRN+2. In this way, the falling timing of the sensing gate signal SSN may be set to be later than the falling timing of the scan gate signal SCN by the predetermined time DEL2.

As shown in FIG. 11, the second next carry signal for enhancing the falling characteristics of the N-th stage may be CRN+2 and the second next carry signal for enhancing the falling characteristics of the N+1-th stage may be CRN+3.

Like the N-th stage, the N+1-th stage may further include an 8-2 transistor T8-2B for enhancing a falling characteristic of the scan gate signal SCN+1.

According to the present embodiment, the N-th stage and the N+1-th stage may share the QBN node and share the portion of circuits so that the number of the transistors in the gate driving circuit and the number of the signal lines may be greatly reduced. Thus, the dead space of the display apparatus may be reduced.

In addition, at least one of the scan gate output circuit, the sensing gate output circuit and the carry output circuit includes the transistor for enhancing a falling time so that a falling time of at least one of the scan gate signal, the sensing gate signal and the carry signal may be enhanced so that the display quality of the display panel may be enhanced.

In addition, the scan gate output circuit may include the transistor T8-2A and T8-2B for enhancing the falling time and the sensing gate output circuit may not include the transistor T11-2A and T11-2B for enhancing the falling time so that the falling time of the sensing gate signal may be delayed than the falling time of the scan gate signal. Thus, the display quality of the display panel 100 may be enhanced.

According to the gate driver and the display apparatus in the present disclosure, the number of the signal lines and the number of the transistors may be reduced so that the dead space of the display apparatus may be reduced and the display quality of the display panel may be enhanced.

The foregoing is illustrative of the present disclosure and is not to be construed as limiting thereof. Although a few embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A gate driving circuit comprising:
   an N-th stage to output an N-th scan gate signal based on an N-th scan clock signal, a voltage of a QN node and a voltage of a QBN node, and to output an N-th carry signal based on an N-th carry clock signal, the voltage of the QN node and the voltage of the QBN node; and
   an N+1-th stage to output an N+1-th scan gate signal based on an N+1-th scan clock signal, a voltage of a QN+1 node and the voltage of the QBN node, and to output an N+1-th carry signal based on an N+1-th carry clock signal, the voltage of the QN+1 node and the voltage of the QBN node,
   wherein the N-th stage and the N+1-th stage share an inverting circuit,
   wherein the inverting circuit controls the QBN node based on a third signal,
   wherein N is a positive integer,
   wherein the N-th stage further comprises a second pull down control circuit which outputs a first low voltage to the QBN node in response to a previous carry signal, and
   wherein the N-th stage and the N+1-th stage share the second pull down control circuit.

2. The gate driving circuit of claim 1, wherein the N-th stage includes a scan gate output circuit, and
wherein the scan gate output circuit includes:
a sixth transistor to apply an N-th scan clock signal to a scan gate output node in response to the QN node;
an eighth transistor to apply a second low voltage to the scan gate output node in response to the QBN node; and
a first capacitor connected between a control electrode of the sixth transistor and the scan gate output node.

3. The gate driving circuit of claim 2, wherein the N-th stage further includes a sensing gate output circuit, and
wherein the sensing gate output circuit includes:
a ninth transistor to apply an N-th sensing clock signal to a sensing gate output node in response to the QN node;
an eleventh transistor to apply the second low voltage to the sensing gate output node in response to the QBN node; and
a second capacitor connected between a control electrode of the ninth transistor and the sensing gate output node.

4. The gate driving circuit of claim 3, wherein the N-th stage further includes a carry output circuit, and
wherein the carry output circuit includes:
a twelfth transistor to apply an N-th carry clock signal to a carry output node in response to the QN node; and
a fourteenth transistor to apply the first low voltage to the carry output node in response to the QBN node.

5. The gate driving circuit of claim 4, wherein the scan gate output circuit further includes an 8-2 transistor to apply the second low voltage to the scan gate output node in response to a next carry signal which is one of carry signals of next stages,
wherein the sensing gate output circuit further includes an 11-2 transistor to apply the second low voltage to the sensing gate output node in response to the next carry signal, and
wherein the carry output circuit further includes a 14-2 transistor to apply the first low voltage to the carry output node in response to the next carry signal.

6. The gate driving circuit of claim 4, wherein the scan gate output circuit further includes an 8-2 transistor to apply the second low voltage to the scan gate output node in response to a next carry signal which is one of carry signals of next stages, and
wherein the sensing gate output circuit further includes an 11-2 transistor to apply the second low voltage to the sensing gate output node in response to the next carry signal.

7. The gate driving circuit of claim 1, wherein the N-th stage and the N+1-th stage share a first sensing circuit,
wherein the first sensing circuit includes a twenty first transistor, a twenty second transistor and a twenty third transistor,
wherein the twenty first transistor includes a control electrode to receive a first signal, a first electrode to receive the previous carry signal which is one of carry signals of previous stages, and a second electrode connected to a second electrode of the twenty second transistor,
wherein the twenty third transistor includes a control electrode to receive the first signal, a first electrode connected to the second electrode of the twenty first transistor, and a second electrode connected to a control electrode of the twenty second transistor, and
wherein the twenty second transistor includes the control electrode connected to the second electrode of the twenty third transistor, a first electrode to receive a sixth signal, and the second electrode connected to the second electrode of the twenty first transistor.

8. The gate driving circuit of claim 7, wherein the N-th stage includes a second sensing circuit,
wherein the second sensing circuit of the N-th stage includes a twenty fourth transistor, a 25-1 transistor, a 25-2 transistor, and a third capacitor,
wherein the twenty fourth transistor of the N-th stage includes a control electrode connected to the second electrode of the twenty third transistor, a first electrode to receive the sixth signal, and a second electrode connected to a first electrode of the 25-1 transistor of the N-th stage,
wherein the 25-1 transistor of the N-th stage includes a control electrode to receive a second signal, the first electrode connected to the second electrode of the twenty fourth transistor of the N-th stage, and a second electrode connected to a first electrode of the 25-2 transistor of the N-th stage,
wherein the 25-2 transistor of the N-th stage includes a control electrode to receive the second signal, the first electrode connected to the second electrode of the 25-1 transistor of the N-th stage, and a second electrode connected to the QN node, and
wherein the third capacitor includes a first electrode to receive the sixth signal and a second electrode connected to the control electrode of the twenty fourth transistor of the N-th stage.

9. The gate driving circuit of claim 8, wherein the N+1-th stage includes a second sensing circuit,
wherein the second sensing circuit of the N+1-th stage includes a twenty fourth transistor, a 25-1 transistor, and a 25-2 transistor, and
wherein the second sensing circuit of the N-th stage and the second sensing circuit of the N+1-th stage share the third capacitor.

10. The gate driving circuit of claim 7, wherein the first sensing circuit further includes a twenty sixth transistor and a twenty seventh transistor,
wherein the twenty sixth transistor includes a control electrode to receive a second signal, a first electrode connected to a second electrode of the twenty seventh transistor, and a second electrode connected to the QBN node, and
wherein the twenty seventh transistor includes a control electrode connected to the second electrode of the twenty third transistor, a first electrode to receive the first low voltage, and the second electrode connected to the first electrode of the twenty sixth transistor.

11. The gate driving circuit of claim 1, wherein the N-th stage includes a first pull up control circuit, and
wherein the first pull up control circuit outputs the previous carry signal which is one of carry signals of previous stages to the QN node in response to the previous carry signal.

12. The gate driving circuit of claim 11, wherein the N-th stage further includes a second pull up control circuit, and
wherein the second pull up control circuit outputs the first low voltage to the QN node in response to a next carry signal which is one of carry signals of next stages.

13. The gate driving circuit of claim 12, wherein the N-th stage further includes a third pull up control circuit, and
wherein the third pull up control circuit outputs the first low voltage to the QN node in response to the voltage of the QBN node.

14. The gate driving circuit of claim 1, wherein the N-th stage includes a scan gate output circuit, a sensing gate output circuit, and a carry output circuit,
wherein the scan gate output circuit includes:
a sixth transistor to apply an N-th scan clock signal to a scan gate output node in response to the QN node;
an eighth transistor to apply a second low voltage to the scan gate output node in response to the QBN node; and
a first capacitor connected between a control electrode of the sixth transistor and the scan gate output node,
wherein the sensing gate output circuit includes:
a ninth transistor to apply the N-th scan clock signal to a sensing gate output node in response to the QN node;
an eleventh transistor to apply the second low voltage to the sensing gate output node in response to the QBN node; and
a second capacitor connected between a control electrode of the ninth transistor and the sensing gate output node, and
wherein the carry output circuit includes:
a twelfth transistor to apply an N-th carry clock signal to a carry output node in response to the QN node; and
a fourteenth transistor to apply the first low voltage to the carry output node in response to the QBN node.

15. The gate driving circuit of claim 14, wherein the scan gate output circuit further includes an 8-2 transistor to apply the second low voltage to the scan gate output node in response to a next carry signal which is one of carry signals of next stages, and
wherein the carry output circuit further includes a 14-2 transistor to apply the first low voltage to the carry output node in response to the next carry signal.

16. The gate driving circuit of claim 14, wherein the scan gate output circuit further includes an 8-2 transistor to apply the second low voltage to the scan gate output node in response to a next carry signal which is one of carry signals of next stages.

17. The gate driving circuit of claim 1, wherein the inverting circuit includes a 15-1 transistor, a 15-2 transistor, and an eighteenth transistor,
wherein the 15-1 transistor includes a control electrode to receive the third signal, a first electrode to receive the third signal, and a second electrode connected to a second electrode of the 15-2 transistor,
wherein the 15-2 transistor includes a control electrode to receive the third signal, a first electrode connected to a control electrode of the eighteenth transistor, and the second electrode connected to the second electrode of the 15-1 transistor, and
wherein the eighteenth transistor includes the control electrode connected to the first electrode of the 15-2 transistor, a first electrode to receive the third signal, and a second electrode connected to the QBN node.

18. The gate driving circuit of claim 17, wherein the inverting circuit further includes a sixteenth transistor and a seventeenth transistor,
wherein the sixteenth transistor includes a control electrode connected to the QN node, a first electrode to receive a second low voltage, and a second electrode connected to the control electrode of the eighteenth transistor, and
wherein the seventeenth transistor includes a control electrode connected to the QN+1 node, a first electrode to receive the second low voltage, and a second electrode connected to the control electrode of the eighteenth transistor.

19. The gate driving circuit of claim 1, wherein the N-th stage includes a first pull down control circuit, and
wherein the first pull down control circuit outputs the first low voltage to the QBN node in response to the voltage of the QN node.

20. A display apparatus comprising:
a display panel;
a gate driver to output a gate signal to the display panel; and
a data driver to output a data voltage to the display panel,
wherein a gate driving circuit of the gate driver includes:
an N-th stage to output an N-th scan gate signal based on an N-th scan clock signal, a voltage of a QN node and a voltage of a QBN node, and to output an N-th carry signal based on an N-th carry clock signal, the voltage of the QN node and the voltage of the QBN node; and
an N+1-th stage to output an N+1-th scan gate signal based on an N+1-th scan clock signal, a voltage of a QN+1 node and the voltage of the QBN node, and to output an N+1-th carry signal based on an N+1-th carry clock signal, the voltage of the QN+1 node and the voltage of the QBN node,
wherein the N-th stage and the N+1-th stage share an inverting circuit,
wherein the inverting circuit controls the QBN node based on a third signal,
wherein N is a positive integer,
wherein the N-th stage further comprises a second pull down control circuit which outputs a first low voltage to the QBN node in response to a previous carry signal, and
wherein the N-th stage and the N+1-th stage share the second pull down control circuit.

* * * * *